(12) United States Patent
Wang et al.

(10) Patent No.: US 11,645,031 B2
(45) Date of Patent: May 9, 2023

(54) FRAME AND MULTI-SCREEN INTERACTIVE DISPLAY DEVICE

(71) Applicant: BOE TECHNOLOGY GROUP CO., LTD., Beijing (CN)

(72) Inventors: Zifeng Wang, Beijing (CN); Yan Ren, Beijing (CN); Lei Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 360 days.

(21) Appl. No.: 17/044,177

(22) PCT Filed: Nov. 27, 2019

(86) PCT No.: PCT/CN2019/121337
§ 371 (c)(1),
(2) Date: Sep. 30, 2020

(87) PCT Pub. No.: WO2021/022724
PCT Pub. Date: Feb. 11, 2021

(65) Prior Publication Data
US 2021/0141582 A1    May 13, 2021

(30) Foreign Application Priority Data

Aug. 6, 2019  (CN) .......................... 201921269816.9
Aug. 8, 2019  (CN) .......................... 201921286652.0

(51) Int. Cl.
*F16S 1/10* (2006.01)
*G06F 3/14* (2006.01)
*G06F 1/18* (2006.01)

(52) U.S. Cl.
CPC ............ *G06F 3/1423* (2013.01); *G06F 1/181* (2013.01)

(58) Field of Classification Search
CPC ..... A47B 96/02; A47B 57/52; A47B 47/0058; A47B 47/0083; A47B 47/021;
(Continued)

(56) References Cited

U.S. PATENT DOCUMENTS 5,785,359 A  *  7/1998  Nagai .................... F16B 7/046
                                                    403/255
5,806,897 A  *  9/1998  Nagai .................. B23Q 1/0018
                                                    285/125.1
(Continued)

FOREIGN PATENT DOCUMENTS

CN         203336214 U    12/2013
CN         204002391 U    12/2014
(Continued)

OTHER PUBLICATIONS

Office Action dated Nov. 23, 2021 in U.S. Appl. No. 16/986,540, 24 total pages.
(Continued)

*Primary Examiner* — Terrell L McKinnon
*Assistant Examiner* — Michael McDuffie
(74) *Attorney, Agent, or Firm* — Procopio, Cory, Hargreaves & Savitch LLP

(57) ABSTRACT

A frame includes a plurality of profile sections and at least one first adapter assembly. Each profile section includes at least one section extension surface, and one of the at least one section extension surface is provided with at least one first groove therein. Each first adapter assembly includes a first position-limiting block provided with at least one first mounting hole therein. The first position-limiting block is configured to be fixed in a first groove during assembly, and to fix other components to the profile section through the at least one first mounting hole.

20 Claims, 11 Drawing Sheets

(58) Field of Classification Search
CPC ....... F16B 12/00; F16M 13/02; G06F 3/1423;
G06F 3/14; G06F 1/181; G06F 3/1454;
G06F 3/165; H02B 1/301; G09F 9/302;
G09F 9/30; G09F 9/3026; G09F 15/0012;
G09F 27/00
USPC .... 248/689, 220.21, 220.22, 220.43, 223.41,
248/224.61, 224.7, 224.8, 222.41, 223.21
See application file for complete search history.

(56) References Cited

U.S. PATENT DOCUMENTS

| | | | |
|---|---|---|---|
| 6,174,034 B1 | 1/2001 | Benner et al. | |
| 6,305,764 B1 | 10/2001 | Kortman et al. | |
| 6,712,543 B1 * | 3/2004 | Schmalzhofer | F16B 7/187 403/258 |
| 6,764,245 B2 * | 7/2004 | Popovski | F16B 7/0466 403/374.2 |
| 7,537,188 B2 * | 5/2009 | Root | F16M 13/00 248/295.11 |
| 7,878,476 B2 * | 2/2011 | Carson | F16M 13/02 248/920 |
| 8,100,600 B2 * | 1/2012 | Blum | F16B 37/045 403/256 |
| 8,844,180 B2 * | 9/2014 | Kludt | H05K 5/06 248/223.41 |
| 8,910,580 B1 * | 12/2014 | Cockrell | A47B 81/06 108/50.02 |
| 9,134,950 B2 | 9/2015 | Choi et al. | |
| 9,282,676 B1 * | 3/2016 | Diaz | G09F 27/00 |
| 9,315,985 B2 * | 4/2016 | Gosling | E04B 2/7422 |
| 9,458,952 B2 * | 10/2016 | Zhang | F16L 3/10 |
| 9,599,280 B2 * | 3/2017 | West | F24S 25/67 |
| 10,206,506 B1 * | 2/2019 | Lai | A47B 96/1433 |
| 10,508,452 B2 * | 12/2019 | Hooper | E01F 7/025 |
| 10,512,190 B2 * | 12/2019 | Anderson | H02B 1/301 |
| 10,662,650 B2 * | 5/2020 | Lacroix | E04C 3/06 |
| 2010/0282932 A1 | 11/2010 | Ong et al. | |
| 2014/0192530 A1 * | 7/2014 | Liu | F21V 17/007 362/249.02 |
| 2016/0379530 A1 * | 12/2016 | Lewis | F16M 13/02 248/475.1 |
| 2020/0016446 A1 * | 1/2020 | Speckmaier | A63B 21/169 |
| 2020/0080683 A1 * | 3/2020 | Flowers | F16M 11/041 |
| 2021/0237655 A1 * | 8/2021 | Stener | B60R 11/00 |

FOREIGN PATENT DOCUMENTS

| | | |
|---|---|---|
| CN | 105307447 A | 2/2016 |
| CN | 205383407 U | 7/2016 |
| CN | 107007052 A | 8/2017 |

OTHER PUBLICATIONS

Office Action dated Oct. 14, 2020 in counterpart CN Patent Application No. 201990000201.8, 5 pages.

European Patent Office. Supplementary European Search Report dated Sep. 12, 2022. Application No./Patent No. 19940407.0-1201/4013200. International Application No. PCT/CN2019121337. Name of Applicant: BOE Technology Group Co., Ltd. English Language. 9 pages.

* cited by examiner

FRAME AND MULTI-SCREEN INTERACTIVE DISPLAY DEVICE

CROSS-REFERENCE TO RELATED APPLICATIONS

This application is a national phase entry under 35 USC 371 of International Patent Application No. PCT/CN2019/121337 filed on Nov. 27, 2019, which claims priorities to and the benefits of Chinese Patent Application No. 201921269816.9, filed with the State Intellectual Property Office on Aug. 6, 2019, titled "INTERACTIVE DISPLAY DEVICE AND INTERACTIVE DISPLAY SYSTEM", and Chinese Patent Application No. 201921286652.0, filed with the State Intellectual Property Office on Aug. 8, 2019, titled "LOCKING MECHANISM, DETACHABLE PROFILE AND DISPLAY DEVICE", which are incorporated herein by reference in their entireties.

TECHNICAL FIELD

The present disclosure relates to the field of display technologies, and in particular, to a frame and a multi-screen interactive display device.

BACKGROUND

Electronic display devices are often used in some conferences rich in communication, such as business conferences and medical consultations, to assist conferees in better understanding contents of the conferences.

At present, the conferences rich in communication, such as the business conferences and the medical consultations, are held at fixed locations, and the conferees are required to attend the conferences at the conference locations if conference interaction is required. However, those who cannot attend the conferences cannot participate in the conference interaction directly, and only can participate in the conference interaction through electronic communication manners such as telephone calls and short messages, which not only reduces participation of the conference interaction, but also affects conference interaction efficiency and reduces use experience of users. In order to perform multi-party communication in real time and display multi-party scenes in a better three-dimensional manner, more and more multi-screen interactive display devices are produced. These devices facilitate the real-time communication and detail discussions through high-definition display. Compared with pure telephone calls or text messages, the communication experience is better and the communication efficiency is greatly improved.

However, structures of most of existing multi-screen interactive display devices have poor practicability, which causes inconvenient use for the conferees, and the manufacturing cost of the device is high, which is not conducive to mass production.

SUMMARY

The present disclosure provides a frame and a multi-screen interactive display device to improve practicability of the multi-screen interactive display device on a basis of reducing the manufacturing cost of the multi-screen interactive display device.

In a first aspect, the present disclosure provides a frame. The frame includes a plurality of profile sections and at least one first adapter assembly. Each profile section includes at least one section extension surface, and one of the at least one section extension surface is provided with at least one first groove therein. Each first adapter assembly includes a first position-limiting block provided with at least one first mounting hole therein.

The first position-limiting block is configured to be fixed in a first groove during assembly, and to fix other components to at least one profile section through the at least one first mounting hole.

The present disclosure further provides a multi-screen interactive display device. The multi-screen interactive display device includes the frame according to the above technical solution.

DETAILED DESCRIPTION

In order to facilitate a clear description of technical solutions of embodiments of the present disclosure, in the embodiments of the present disclosure, the words "first" and "second" are used to distinguish same or similar items whose functions and effect are substantially the same. For example, a first PUR and a second PUR are only for distinguishing different PURs, and are not for position-limiting an order thereof. A person skilled in the art will understand that, the words "first" and "second" are not intended to limit the quantity and execution order of the items, and do not limit a difference among the items.

It will be noted that, in the present disclosure, the words "for example" or "such as" are used to mean serving as examples, illustrations or explanations. Any embodiment or design described in the present disclosure as "for example" or "such as" should not be construed as being more preferred or advantageous than other embodiments or designs. Rather, use of the words "for example" or "such as" is intended to present relevant concepts in a specific manner.

Embodiments of the present disclosure provide a multi-screen interactive display device, which may be applied to scenarios such as business conferences, medical consultations, teaching, and family gatherings. The multi-screen interactive display device can ensure that people who cannot reach a conference site understand conference contents in real time and interact with conferees. Therefore, compared with traditional communication methods such as telephone calls or text messages, the multi-screen interactive display device provided by the embodiments of the present disclosure may improve conference interaction efficiency and enhance use experience of users.

Figure 1:
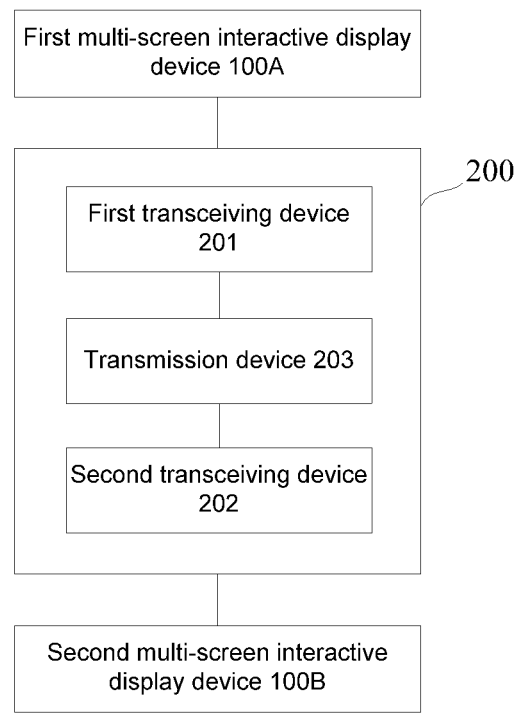
FIG. 1 is a diagram of an application scenario of a multi-screen interactive display device, in accordance with embodiments of the present disclosure.

FIG. 1 shows a multi-screen interactive display system. As shown in FIG. 1, the multi-screen interactive display system includes a first multi-screen interactive display device 100A, a second multi-screen interactive display device 100B, and a communication system 200. Of course, the multi-screen interactive display system may further include more multi-screen interactive display devices, and do not limited to the two multi-screen interactive display devices shown in FIG. 1.

Each multi-screen interactive display device may collect scene information of its location, and may play image information of its location (referred to as local image information hereinafter) or scene information of locations of other multi-screen interactive display devices (referred to as remote image information hereinafter) that is collected by the other multi-screen interactive display devices.

As shown in FIG. 1, the communication system 200 may support communication between two or more multi-screen interactive display devices. The first multi-screen interactive display device 100A and the second multi-screen interactive display device 100B communicate through the communication system 200. The communication system 200 may be a wireless communication device or a wired communication system.

The communication system 200 shown in FIG. 1 includes a first transceiving device 201, a transmission device 203, and a second transceiving device 202. The transmission device 203 may be optical fiber, or may be a Wi-Fi module, a Zigbee module, or the like. Of course, the transmission device 203 may also be a communication device such as a base station. The first transceiving device 201 may be disposed in the first multi-screen interactive display device 100A, or may be independent of the first multi-screen interactive display device 100A. Similarly, the second transceiving device 202 may be disposed in the second multi-screen interactive display device 100B, or may be independent of the second multi-screen interactive display device 100B.

As shown in FIG. 1, the first transceiving device 201 may transmit local image information and audio information collected by the first multi-screen interactive display device 100A to the transmitting device 203, and receive local image information collected by the second multi-screen interactive display device 100B that is transmitted by the second transceiving device 202. The second transceiving device 202 may transmit local image information and audio information collected by the second multi-screen interactive display device 100B to the transmission device 203, and receive local image information collected by the first multi-screen interactive display device 100A that is transmitted by the first transceiving device 201.

Figure 2:
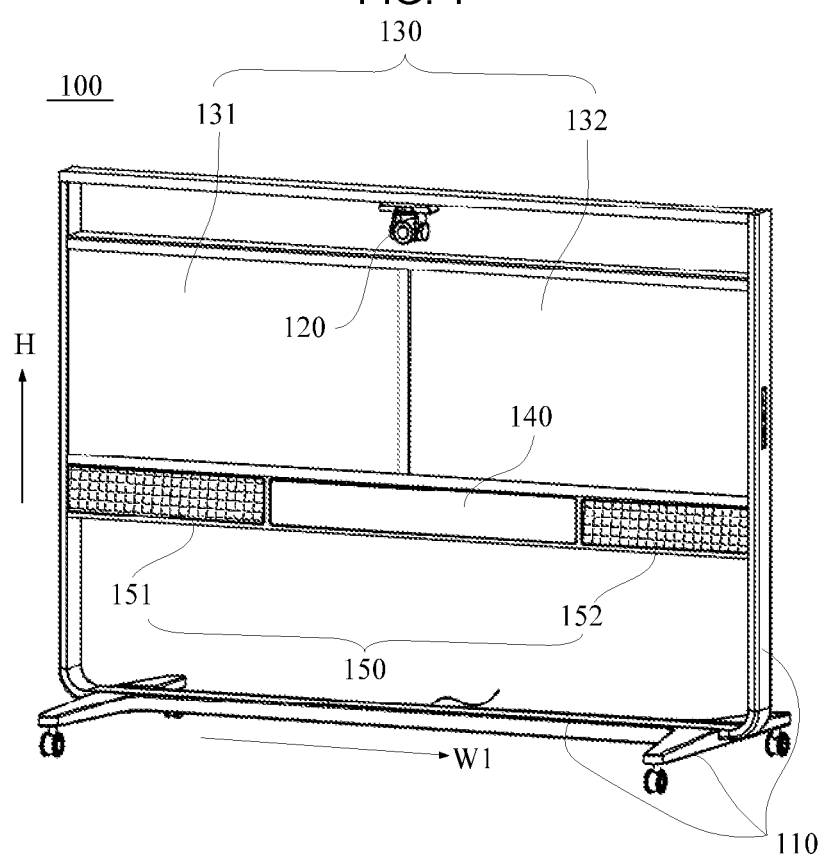
FIG. 2 is a first schematic diagram showing a structure of a multi-screen interactive display device, in accordance with embodiments of the present disclosure.

FIG. 2 is a schematic diagram showing a structure of a multi-screen interactive display device provided by embodiments of the present disclosure. As shown in FIG. 2, the multi-screen interactive display device 100 includes a frame 110. The frame 110 may effectively reduce the manufacturing cost of the multi-screen interactive display device, and improve practicability of the multi-screen interactive display device, thereby improving the use experience of the users.

As a possible implementation, when assembly of the frame 110 is accomplished, the frame 110 encloses an image capture region R1, at least one main display region R2, an auxiliary display region R3, and an audio play region R4. The image capture region R1, the at least one main display region R2, the auxiliary display region R3 and the audio play region R4 are distributed in a height direction of the assembled frame 110. The audio play region R4 and the auxiliary display region R3 are located at a same side of the at least one main display region R2.

The multi-screen interactive display device 100 shown in FIG. 2 further includes an image capture device 120, at least one main display screen 130, an auxiliary display screen 140, and an audio assembly 150.

The image capture device 120 in FIG. 2 may be an image sensor or a camera. The image sensor may be a charge coupled device (CCD) image sensor. The camera may be a black-and-white camera, an infrared camera, or any other camera capable of capturing images. The number of the main display screens 130 is two, but it may also be one, three, or even more. After the assembly of the frame 110 is accomplished, the image capture device 120 is disposed in the image capture region R1 of the assembled frame 110.

Figure 3:
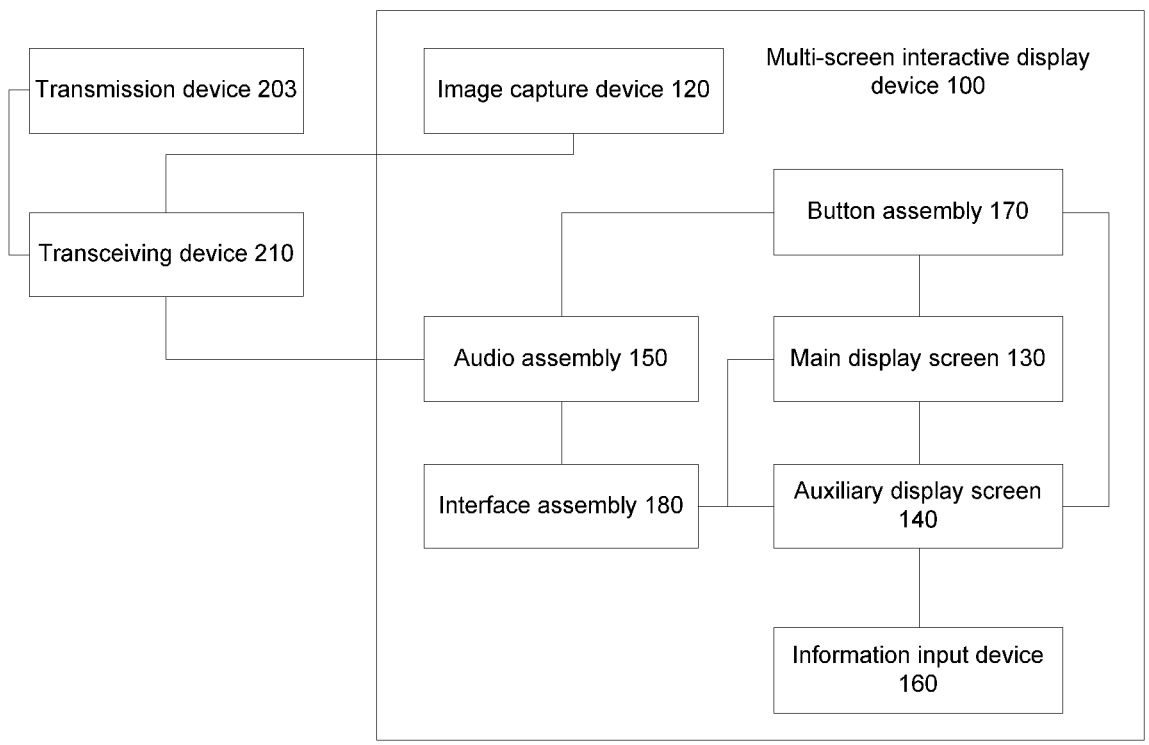
FIG. 3 is a schematic block diagram of a main body of a multi-screen interactive display device, in accordance with embodiments of the present disclosure.

As shown in FIG. 3, the image capture device 120 is configured to be in signal connection with a transceiving device 210. When the image capture device 120 collects local image information, the transceiving device 210 may upload the local image information collected by the image capture device 120 to the transmission device 203.

The main display screen 130 in FIG. 2 is configured to display remote image information, and of course, the main display screen 130 may also display local image information. After the assembly of the frame 110 is accomplished, the main display screen 130 is disposed in the at least one main display region R2 of the assembled frame 110. If the main display screen 130 displays remote image information, an area of the main display screen 130 is greater than an area of the auxiliary display screen 140, so that the users can view the remote image information more conveniently. As shown in FIG. 3, the at least one main display screen 130 is in signal connection with the transceiving device 210. When the transceiving device 210 receives the remote image information, the at least one main display screen 130 may display the remote image information.

The auxiliary display screen 140 shown in FIG. 2 is configured to display local auxiliary information such as reminder information and note information, and of course, the auxiliary display screen 140 may also display the remote image information. After the assembly of the frame 110 is accomplished, the auxiliary display screen 140 is disposed in the auxiliary display region R3 of the assembled frame 110.

As shown in FIG. 2, after the assembly of the frame 110 is accomplished, the audio assembly 150 is disposed in the audio play region R4 of the assembled frame 110. As shown in FIG. 3, the audio assembly 150 is configured to be electrically connected to the at least one main display screen 130, or the auxiliary display screen 140, or the at least one main display screen 130 and the auxiliary display screen 140. When the audio assembly 150 is electrically connected to the at least one main display screen 130, the audio assembly 150 may play audio contents of the remote image information played by the at least one main display screen 130. When the audio assembly 150 is electrically connected to the auxiliary display screen 140, the audio assembly 150 may play audio contents of local reference information played by the auxiliary display screen.

Figure 4:
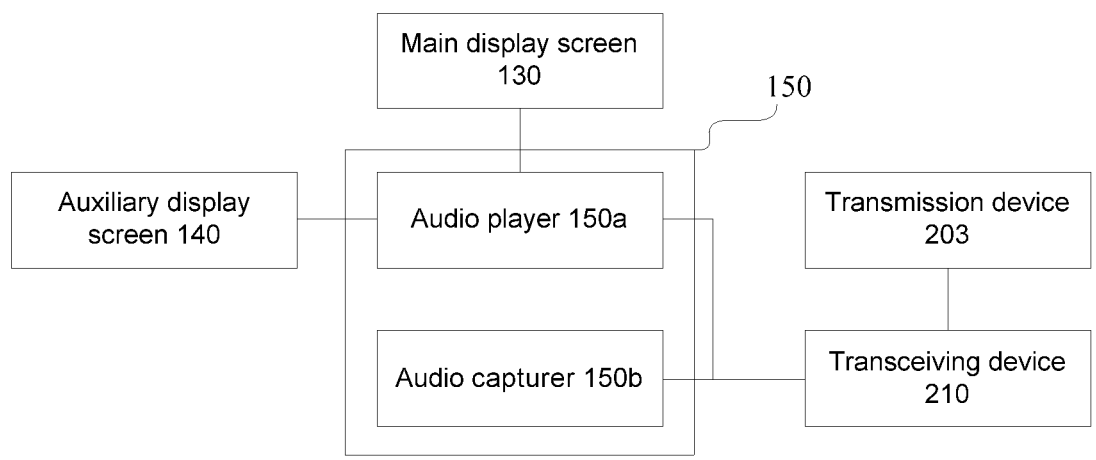
FIG. 4 is a schematic block diagram of a part of a multi-screen interactive display device, in accordance with embodiments of the present disclosure.

For example, as shown in FIG. 4, the audio assembly 150 includes a plurality of audio devices, and the audio devices include an audio player 150*a* and an audio capturer 150*b*. After the assembly of the frame 110 is accomplished, the audio player 150*a* and the audio capturer 150*b* are fixed in the audio play region R4 of the assembled frame 110. Audio information collected by the audio capturer 150*b* is uploaded to the transmission device 203 through the transceiving device 210. The audio player 150*a* is configured to be electrically connected to the at least one main display screen 130, or the auxiliary display screen 140, or the at least one main display screen 130 and the auxiliary display screen 140. Generally, the audio player 150*a* may be a speaker, and the audio capturer 150*b* may be a microphone.

As shown in FIG. 4, when the audio player 150*a* is in signal connection to the auxiliary display screen 140 and the main display screen 130, the audio player 150*a* may not only play audio information contained in the local auxiliary information displayed on the auxiliary display screen 140, but also play audio information contained in the remote image information displayed on the main display screen 130. It will be understood that, the signal connection may be a wired connection or a wireless connection. A wireless connection module used for the wireless connection may be a Wi-Fi module, a Bluetooth module, a Zigbee module, or the like. Various types of wireless connection modules on the market are available to achieve the wireless connection. The Bluetooth module may be CC2541, CC2640, SKB369, RF-BM-SOA, or the like. The Wi-Fi module may be CC3100 from Texas Instruments (TI), MW300 from Marvell, BCM4390 from Broadcom, MT7688 from MediaTek (MTK), or the like. The Zigbee module may be JN5169 from NXP, CC2530 from TI, or the like.

In order to ensure an appearance of the multi-screen interactive display device, each audio device also has a mesh structure. After the assembly of the frame is accomplished, the mesh structure is disposed in the audio play region of the assembled frame, so that the mesh structure may not only play a decorative role, but also filter dust and prevent the dust from entering the audio player and the audio capturer.

Figure 5:
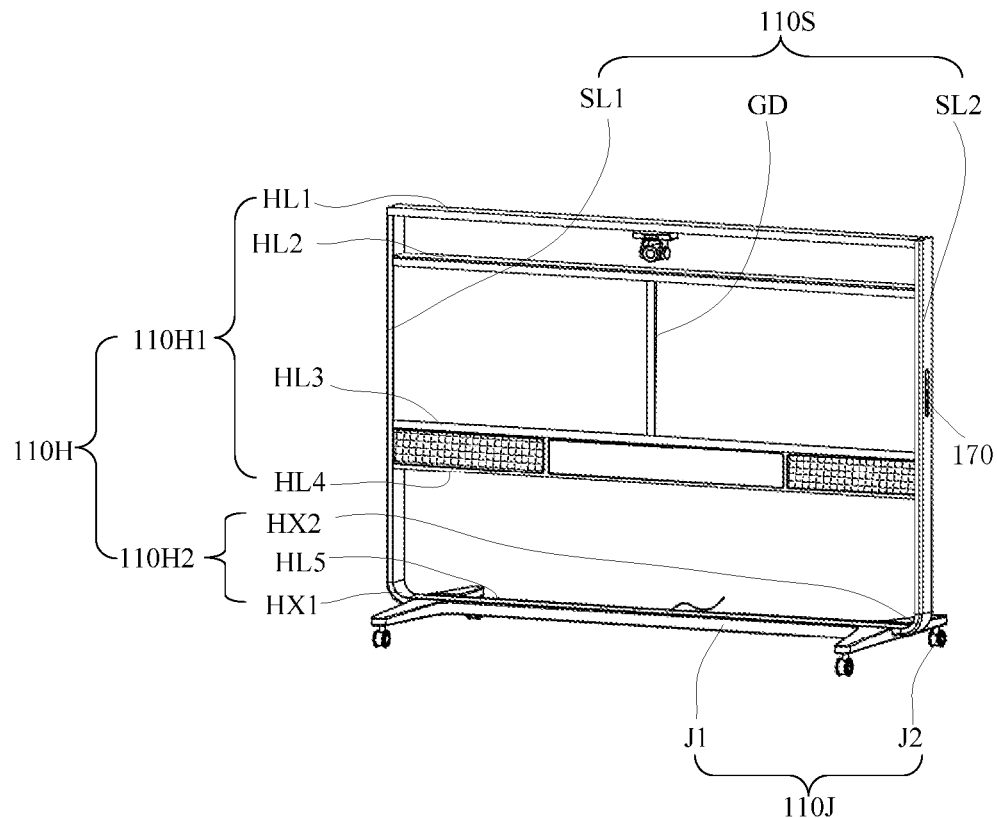
FIG. 5 is a second schematic diagram showing a structure of a multi-screen interactive display device, in accordance with embodiments of the present disclosure.
Figure 7:
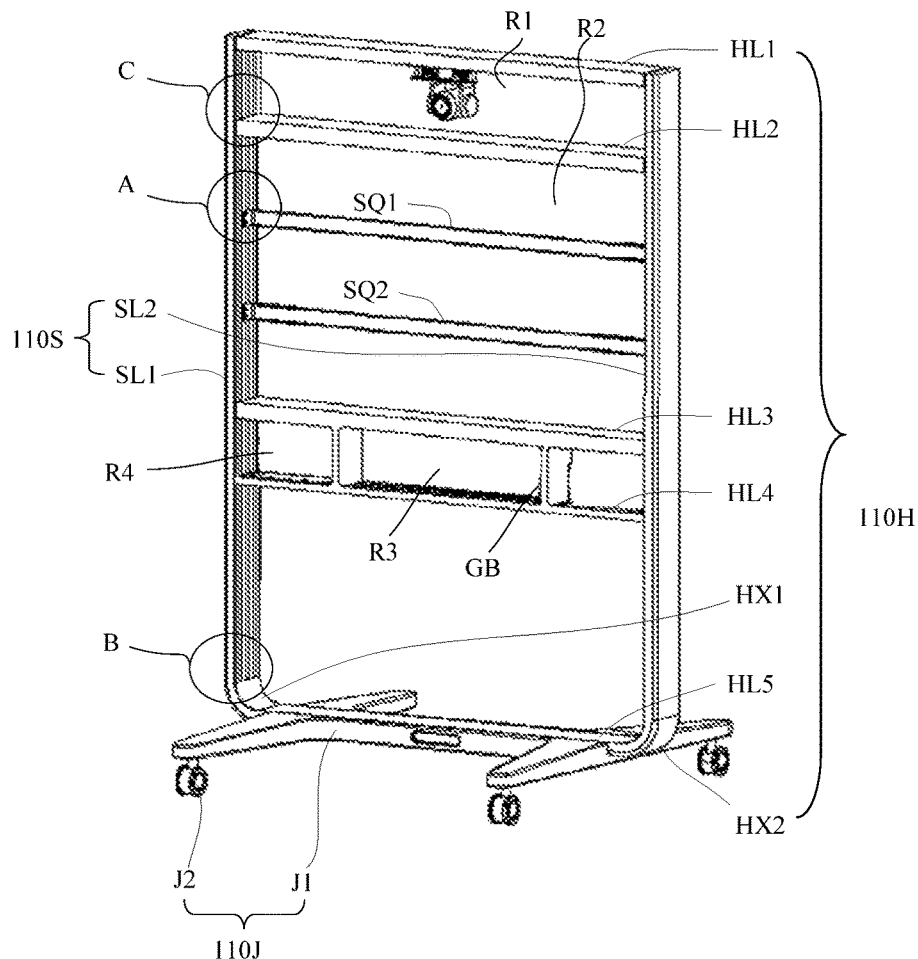
FIG. 7 is a first schematic diagram showing a structure of a frame, in accordance with embodiments of the present disclosure.

It will be noted that, as shown in FIGS. 2, 5 and 7, in a case where the image capture region R1, the at least one main display region R2, the auxiliary display region R3 and the audio play region R4 are distributed in the height direction of the assembled frame 110 (the H direction shown in FIG. 2), and the audio play region R4 and the auxiliary display region R3 are located at the same side of the at least one main display region R2, the image capture device 120, the at least one main display screen 130 and the auxiliary display screen 140 are distributed on the frame 110 in a direction where the height of the frame 110 decreases, and the audio assembly 150 and the auxiliary display screen 140 are located at the same side of the at least one main display screen 130. Since a position of the image capture device 120 is high, a range of a region that the image capture device 120 may cover is wide. Therefore, the image capture device 120 is capable of collecting abundant local image information. A height of the at least one main display screen 130 is greater than a height of the auxiliary display screen 140, which makes the remote information played by the at least one main display screen 130 can cover more local conferees. In this way, more local conferees may understand contents of a remote conference in real time and interact with remote conferees in real time. Although a position of the audio assembly 150 is low, sound will not be unable to spread due to presence of conventional obstacles. Therefore, the low position of the audio assembly 150 will not affect the user's listening to the voice information played by the audio assembly 150, and will not affect the audio assembly 150 to collect local voice information.

As shown in FIG. 2, in a case where there are a plurality of main display screens 130, remote image information played by the plurality of main display screens 130 may be the same or different. The remote image information played by the plurality of main display screens 130 may be image information from a same location or image information from different locations. In addition, the local reference information and the remote image information may be pure texts, pure images, pure videos, or videos with texts.

For example, when doctors in a first location, a second location and a third location conduct a telemedicine conference, the first location, the second location and the third location are each provided with the multi-screen interactive display device 100 shown in FIG. 2. The at least one main display screen 130 in FIG. 2 includes a first main display screen 131 and a second main display screen 132. The first main display screen 131 and the second main display screen 132 are arranged in a width direction of the assembled frame 110 (the W1 direction shown in FIG. 2). In the multi-screen interactive display device installed in the first location, the position of the image capture device 120 is high, and thus it may collect more image information of the first location. Meanwhile, the first main display screen 131 displays image information of the second location, and the second main display screen 132 displays image information of the third location. The audio assembly 150 may play audio information of conferees in the second location and the third location, and record audio information of conferees in the first location. In a case where there is a need to show the local auxiliary information such as the reminder information and the note information to the conferees in the first location, the local auxiliary information may be displayed by the auxiliary display screen.

As a possible implementation, as shown in FIGS. 2 and 3, the local reference information displayed on the auxiliary display screen 140 may be pre-stored in the auxiliary display screen 140, or may be input at any time according to actual needs. In order to facilitate to input local reference information required to be displayed to the auxiliary display screen 140, the multi-screen interactive display device 100 provided by the embodiments of the present disclosure further includes an information input device 160. The information input device 160 is configured to be in signal connection with the auxiliary display screen 140. In a case where all local conferees need to be reminded, local auxiliary information input by the information input device 160 to the auxiliary display screen 140 includes information such as numbers, characters or images, and setting parameters of the auxiliary display screen. It will be understood that, the information input device 160 may be a terminal device such as a telephone, a tablet personal computer, a touch panel or a desktop computer. Of course, the information input device 160 may also include other input devices, which may include, but are not limited to, one or more of a physical keyboard, a trackball, a mouse, a joystick and a voice input device.

As shown in FIGS. 2 to 5, the multi-screen interactive display device 100 further includes a button assembly 170 and an interface assembly 180 that are disposed on the frame 110. The button assembly 170 is electrically connected to the at least one main display screen 130, the auxiliary display screen 140 and the audio assembly 150. The button assembly 170 may be a power switch button, a sound adjustment button, an image brightness adjustment button, or the like.

In order to reduce the manufacturing cost of the multi-screen interactive display device, as shown in FIG. 2, the frame 110 is made of a lightweight profile. A specific structure of the frame will be described below with reference to the accompanying drawings.

Figure 9:
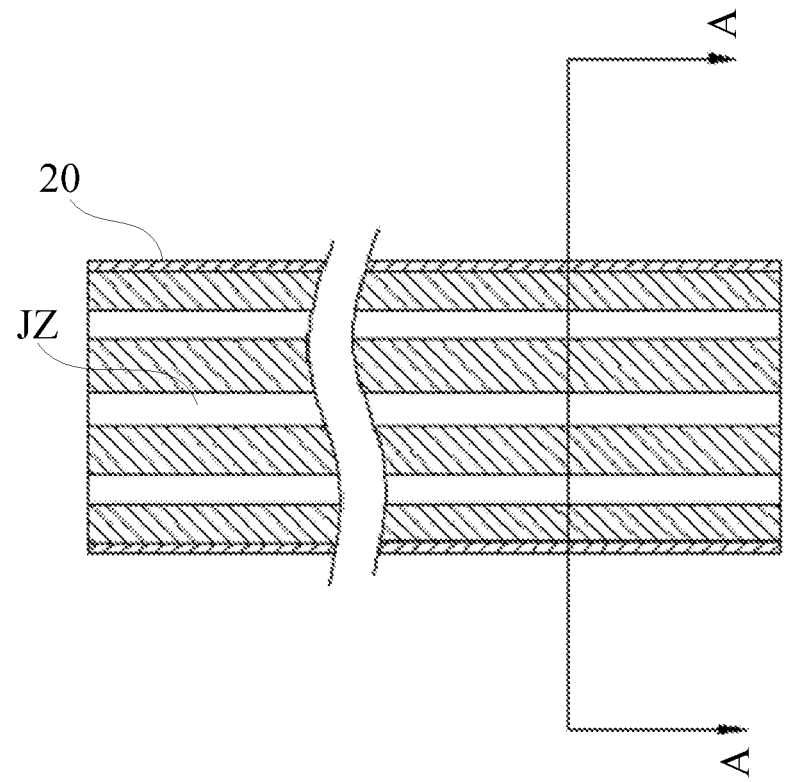
FIG. 9 is a schematic diagram showing a structure of a profile section, in accordance with embodiments of the present disclosure.
Figure 10:
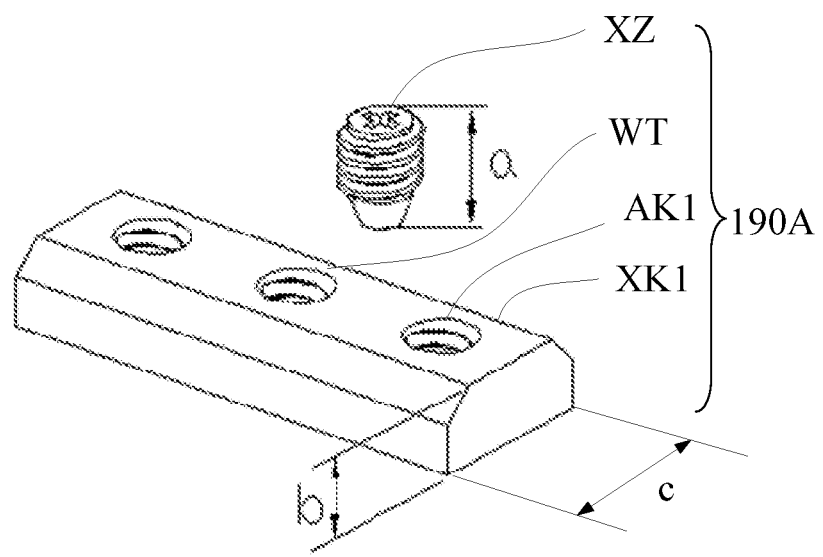
FIG. 10 is a schematic diagram showing a structure of a first adapter assembly, in accordance with embodiments of the present disclosure.

Embodiments of the present disclosure further provide a frame. The frame may be applied to the multi-screen interactive display device 100 shown in FIG. 2. As shown in FIG. 5, the frame provided by the embodiments of the present disclosure may be applied to the frame 110 shown in FIG. 2. The frame includes a plurality of profile sections 20 shown in FIG. 9 and a plurality of first adapter assemblies 190A shown in FIG. 10. As shown in FIG. 10, each first adapter assembly 190A includes a first position-limiting block XK1 provided with at least one first mounting hole AK1 therein. As shown in FIG. 9, a section extension surface of each profile section 20 is provided with at least one first groove JZ therein. The number of the first grooves JZ disposed in the section extension surface of each profile section 20 should be as many as possible, however, the relationship between the processing cost of the profile section 20 and the reduction of the material waste should be balanced as much as possible while ensuring that the profile section 20 has a good structural strength.

As shown in FIG. 9, the section extension directions of the profile section 20 are various, and the profile section 20 may be a linear profile section represented by a strip-shaped profile section 20, or a curved profile section represented by an arc-shaped profile section. Herein, the section extension surface of the profile section 20 refers to a plane extending in the section extension direction, and a length of the section extension surface in this direction is the greatest. For example, in a case where the profile section 20 is a strip-shaped profile section, the section extension direction of the profile section 20 is an extension direction of the strip profile of the strip-shaped profile section, and the section extension surface refers to an extension surface in the extension direction of the strip profile of the strip-shaped profile section. For another example, in a case where the profile section 20 is an arc-shaped profile section, the section extension direction of the profile section 20 is a change direction of the arc of the arc-shaped profile section, and the section extension surface refers to an extension surface in the change direction of the arc of the arc-shaped profile section.

Figure 12:
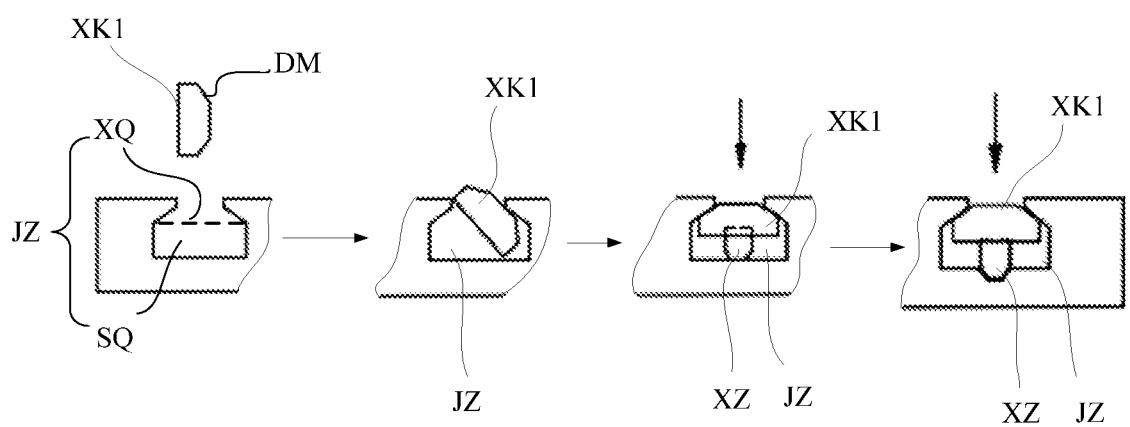
FIG. 12 is a schematic diagram showing an assembly process of a profile section and a first adapter assembly that achieves a first fixing manner, in accordance with embodiments of the present disclosure.

As shown in FIG. 12, when the frame is assembled, the first position-limiting block XK1 is fixed in a first groove JZ, and other components are fixed to the profile section 20 through the at least one first mounting hole AK1 disposed in the first position-limiting block XK1. It will be understood that, when the frame is assembled, one or more first position-limiting blocks XK1 may be fixed in the at least one first groove JZ disposed in the profile section 20, which is determined according to actual use scenarios.

Figure 11:
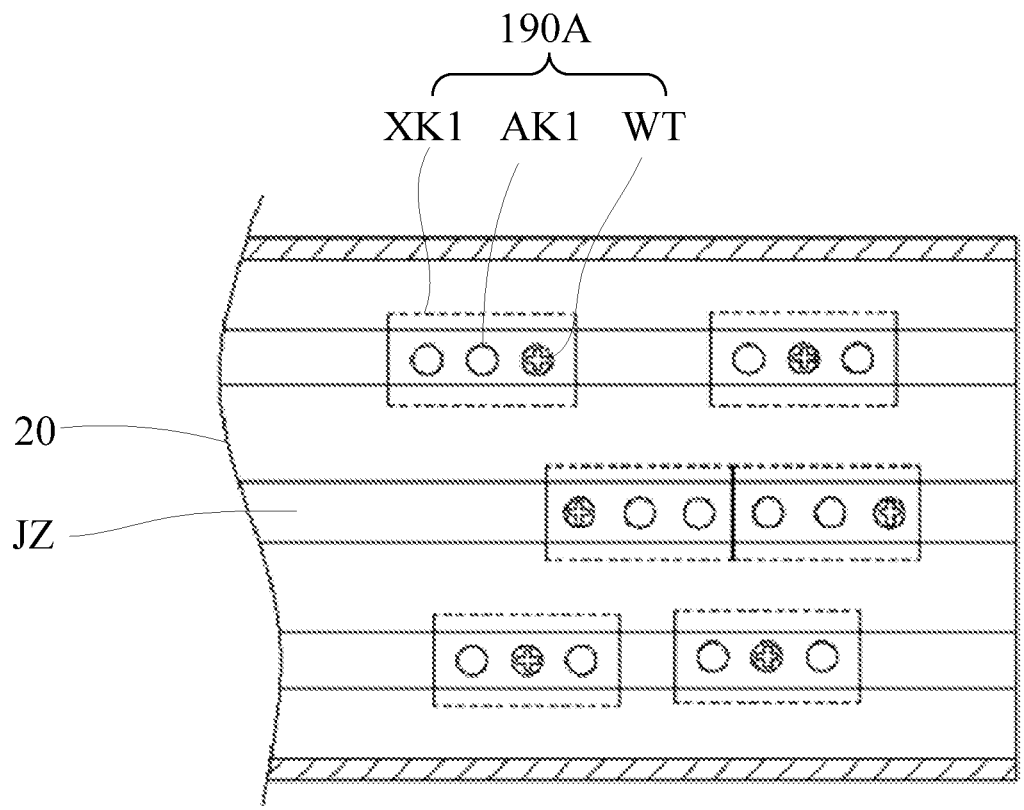
FIG. 11 is a schematic diagram showing an assembled state of a profile section and first adapter assemblies, in accordance with embodiments of the present disclosure.
Figure 17:
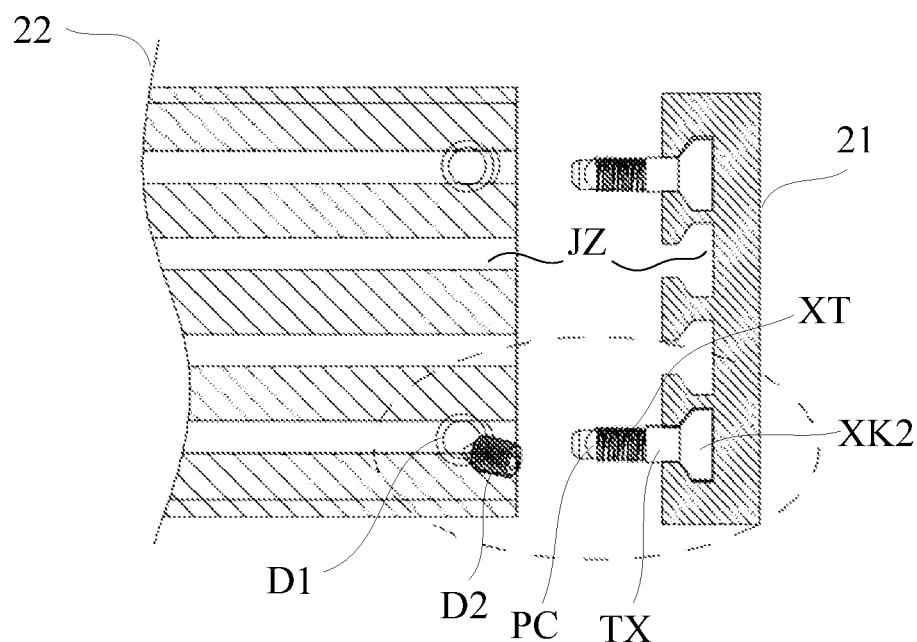
FIG. 17 is a schematic diagram of an application scenario of the second adapter assembly shown in FIG. 16.

For example, as shown in FIG. 17, the section extension surface of the profile section 20 is provided with four first grooves JZ. However, the number of the first grooves JZ disposed in each profile section 20 may also be adjusted according to actual situations. As shown in FIG. 11, when the frame 110 is assembled, with respect to a single profile section 20, one or more first position-limiting blocks XK1 may be fixed in any first groove JZ according to different mounting positions of other components, or no first position-limiting block(s) XK1 may be disposed.

After the frame provided by the embodiments of the present disclosure is assembled, as shown in FIGS. 2 and 5, the image capture device 120, the first main display screen 131, the second main display screen 132, the auxiliary display screen 140, the first audio device 151 and the second audio device 152 are installed on the frame according to positions shown in FIG. 2 and are wired, thereby accomplishing the assembly of the multi-screen interactive display device.

For example, before the image capture device 120 is installed on the frame 110, the first position-limiting block XK1 is fixed in a first groove JZ of a profile section 20 corresponding to the image capture device 120 shown in FIG. 2. It will be understood that the first groove JZ is able to accommodate the first position-limiting block XK1.

In an example, as shown in FIGS. 9 and 10, in a case where the first groove JZ penetrates end(s) of the profile section 20, the first position-limiting block XK1 may be placed into the first groove from the end of the profile section 20, and then the first position-limiting block XK1 is slid in the first groove JZ, so that the first position-limiting block reaches an installation position of the image capture device 120 on the profile section.

In another example, as shown in FIGS. 9, 10 and 12, in a case where a size of the first position-limiting block XK1 is appropriate, the first position-limiting block XK1 may be placed into the first groove JZ through an opening of the first groove JZ.

As shown in FIG. 12, in order to prevent the first position-limiting block XK1 from coming out of the opening, after the assembly of the frame is accomplished, an orthographic projection of the opening of the first groove JZ on a plane where a bottom of the first groove JZ is located is within an orthographic projection of the first position-limiting block XK1 on the plane where the bottom of the first groove JZ is located. In this case, the first position-limiting block XK1 cannot come out of the opening.

As will be seen from the above that, as shown in FIGS. 5, 9 to 12, the section extension surface of each profile section 20 is provided with at least one first groove JZ, which makes the amount of the used material of each profile section 20 small, and ensures a light weight of the assembled frame. Therefore, in a case where the frame provided by the embodiments of the present disclosure is applied to the multi-screen interactive display device, the manufacturing cost of the multi-screen interactive display device may be effectively reduced. In addition, in the frame provided by the embodiments of the present disclosure, each first adapter assembly 190A includes the first position-limiting block XK1 provided with the at least one first mounting hole AK1 therein. The first position-limiting block XK1 is configured to be fixed in the first groove JZ during the assembly, and thus other components may be firmly fixed to the assembled frame, and the fixing reliability of other components may be improved. The first position-limiting block XK1 is configured to fix other components to the profile section 20 through the at least one first mounting hole AK1, therefore, in the case where the frame provided by the embodiments of the present disclosure is applied to the multi-screen interactive display device, after the frame is assembled, other components may be firmly fixed to the assembled frame under the situation that the first position-limiting block XK1 will not come out of the first groove JZ. In the case where the frame provided by the embodiments of the present disclosure is applied to the multi-screen interactive display device, the users may flexibly fix the first position-limiting block XK1 in the first groove flexibly according to different actual fixed positions, and fix other components that need to be fixed to the assembled frame through the first position-limiting block XK1, thereby improving the practicability of the structure of the multi-screen interactive display device.

As a possible implementation, as shown in FIGS. 2 and 5, after assembly of the plurality of profile sections 20 shown in FIG. 9 is accomplished, they enclose the image capture region R1, the at least one main display region R2, the auxiliary display region R3 and the audio play region R4. The image capture region R1, the at least one main display region R2 and the auxiliary display region R3 are distributed in the height direction of the assembled frame 110, and the audio play region R4 and the auxiliary display region R3 are located at the same side of the at least one main display region R2. For example, the frame shown in FIG. 7 includes one main display region R2. The frame shown in FIG. 8 includes two main display regions R2.

As a possible implementation, as shown in FIGS. 5 to 8, the plurality of profile sections 20 shown in FIG. 9 include a horizontal beam assembly 110H and a vertical beam assembly 110S according to different usage modes. After the frame is assembled, the horizontal beam assembly 110H and the vertical beam assembly 110S are fixed together.

For the purpose of movement, as shown in FIGS. 5 to 9, the frame 110 further includes a movable base 110J. After the assembly of the frame is accomplished, the horizontal beam assembly 110H is disposed on the movable base 110J. For example, the horizontal beam assembly 110H may be detachably disposed on (e.g., stuck in) the movable base 110J. For example, in a case where the horizontal beam assembly includes a first horizontal beam assembly and a second horizontal beam assembly, after the first horizontal beam assembly 110H1 and the vertical beam assembly 110S are fixed together, the second beam assembly 110H2 is stuck in the movable base 110J and is fixed with the vertical beam assembly 110S.

For example, as shown in FIG. 5, the vertical beam assembly 110S includes a first vertical beam SL1, a second vertical beam SL2 and at least one partition beam GD. The first vertical beam SL1 is fixed with a first end of the horizontal beam assembly 110H, the second vertical beam SL2 is fixed with a second end of the horizontal beam assembly 110H and there is a partition beam GD between two adjacent main display screens 130. Each partition beam GD is fixed with the first horizontal beam assembly 110H1, so that the first horizontal beam assembly 110H1, the first vertical beam SL1 and the second vertical beam SL2 enclose a plurality of main display regions. It will be understood that, as shown in FIG. 7, the frame may further include a partition plate assembly for separating the auxiliary display region R3 from the audio play region R4.

Figure 6:
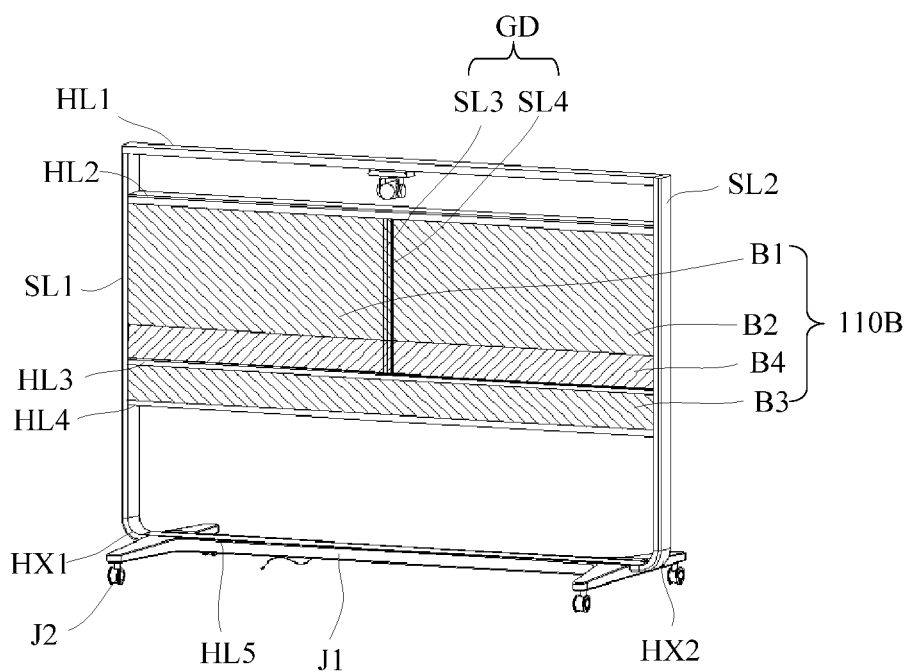
FIG. 6 is a third schematic diagram showing a structure of a multi-screen interactive display device, in accordance with embodiments of the present disclosure.

For example, as shown in FIGS. 5, 6 and 10, the frame further includes a back plate assembly 1106. When the frame 110 is assembled, the first limiting block XK1 fixes the back plate assembly 1106 and the profile sections 20 together through the at least one first mounting hole AK1.

As shown in FIGS. 5 and 6, after assembly of the multi-screen interactive display device is accomplished, the back plate assembly 1106 is located at a back of the at least one main display screen 130, a back of the auxiliary display screen 140 and a back of the audio assembly 150. In this case, the back plate assembly 1106 may not only cover the back of the at least one main display screen 130, the back of the auxiliary display screen 140 and the back of the audio assembly 150 and improve the user experience, but also stabilize the at least one main display 130, the auxiliary display screen 140 and the audio assembly 150 to prevent the at least main display screen 130, the auxiliary display screen 140 and the audio assembly 150 on the frame 110 from shaking.

Specifically, as shown in FIGS. 5 to 8, the back plate assembly 1106 includes at least one back plate and at least one locking bar. When the frame is in an assembled state, the at least one back plate may cover the back of the at least one main display screen 130, the back of the auxiliary display screen 140 and the back of the audio assembly 150, thereby ensuring that the multi-screen interactive display device 100 has a high visual experience. The at least one locking bar is fixed to the first vertical beam SL1 and the second vertical beam SL2, and is located in the at least one main display region R2. When the frame is in the assembled state, these locking bars may fix some components mounted in at least one main display region, and the fixing manner may be screw fixing or bolt fixing.

As shown in FIGS. 5 to 8, a circuit system or some other components required for the main display screen 130 in the at least one main display region R2 are fixed to the at least one locking bar, which may ensure that the main display screen 130 is accurately mounted in the main display region R2. In addition, the audio assembly 150 disposed in the audio play region R4 is generally a speaker, and the like. A volume of the audio assembly 150 is smaller compared with the space of the audio play region, and the audio assembly 150 does not need to be fixed with a very high accuracy. Therefore, there is no need to specially provide a locking bar to fix the audio assembly.

In a specific implementation, as shown in FIGS. 2 to 5, in the case where the frame 110 is applied to the multi-screen interactive display device 100, the button assembly 170 may be disposed on the first vertical beam SL1, or the second vertical beam SL2, or both the first vertical beam SL1 and the second vertical beam SL2. The interface assembly 180 may be disposed on the horizontal beam assembly 110H, the movable base 110J, or the back plate assembly 110G according to an actual position. For example, in a case where the interface assembly 180 includes a network cable interface, the network cable interface may be disposed on the horizontal beam assembly 110H. The interface assembly 180 includes a digital signal interface, an analog signal interface, an audio signal interface, which are interfaces that maintain an access state during the use of the multi-screen interactive display device. The digital signal interface may be a high definition multimedia interface (HDMI). In a case where the interface assembly 180 includes a power interface, the power interface may be disposed on the back plate assembly 110G.

The frame provided by the embodiments of the present disclosure will be described in detail below with reference to FIGS. 2 to 6 and 8. The following description is only for explanation and not for limitation.

The horizontal beam assembly 110H includes the first horizontal beam assembly 110H1 and the second horizontal beam assembly 110H2. The first horizontal beam assembly 110H1 includes a first horizontal beam HL1, a second horizontal beam HL2, a third horizontal beam HL3 and a fourth horizontal beam HL4. The second horizontal beam assembly 110H2 includes a fifth horizontal beam HL5, a first arc-shaped connector HX1 and a second arc-shaped connector HX2.

The vertical beam assembly 110S includes the first vertical beam SL1, the second vertical beam SL2, and the partition beam GD composed of a third vertical beam SL3 and a fourth vertical beam SL4.

When the frame is assembled, the first horizontal beam HL1, the second horizontal beam HL2, the third horizontal beam HL3, the fourth horizontal beam HL4 and the fifth horizontal beam HL5 are distributed in a direction approaching the movable base 110J. The first vertical beam SL1 is fixed with a first end of the first horizontal beam HL1, a first end of the second horizontal beam HL2, a first end of the third horizontal beam HL3 and a first end of the fourth horizontal beam HL4. The first vertical beam SL1 is fixed with a first end of the fifth horizontal beam HL5 through the first arc-shaped connector HX1. The second vertical beam SL2 is fixed with a second end of the first horizontal beam HL1, a second end of the second horizontal beam HL2, a second end of the third horizontal beam HL3 and a second end of the fourth horizontal beam HL4. The second vertical beam SL2 is fixed with a second end of the fifth horizontal beam HL5 through the second arc-shaped connector HX2. It is defined that, as shown in FIG. 9, section extension directions of each horizontal beam, each vertical beam and each arc-shaped connector are substantially the same as section extension directions of profile sections 20 used by the horizontal beam, the vertical beam and the arc-shaped connector, respectively. Correspondingly, beam extension surfaces of each horizontal beam, each vertical beam and each arc-shaped connector are the same as section extension surfaces of the profile sections 20 used by the horizontal beam, the vertical beam and the arc-shaped connector, respectively.

The back plate assembly 110B includes a first back plate B1, a second back plate B2, a third back plate B3, a fourth back plate B4, a first locking bar SQ1 and a second locking bar SQ2.

As shown in FIGS. 2 and 5, in the case where the assembled frame 110 is applied to the multi-screen interactive display device, the at least one main display screen 130 includes the first main display screen 131 and the second main display screen 132, and the audio assembly 150 includes the first audio device 151 and the second audio device 152. The image capture device 120 is a camera.

The camera is disposed on the first horizontal beam HL1, and the third vertical beam SL3 and the fourth vertical beam SL4 are assembled together and disposed between the second horizontal beam HL2 and the third horizontal beam HL3, so that the third vertical beam SL3 and the fourth vertical beam SL4 divide a region enclosed by the first vertical beam SL1, the second vertical beam SL2, the second horizontal beam HL2 and the third horizontal beam HL3 into two main display regions R2. The first main display screen 131 is disposed in one main display region R2 of the two main display regions R2, and the second main display screen 132 is disposed in the other main display region R2 of the two main display regions R2.

The first audio device 151, the second audio device 152 and the auxiliary display screen 140 are disposed in a region enclosed by the first vertical beam SL1, the second vertical beam SL2, the third horizontal beam HL3 and the fourth horizontal beam HL4. The auxiliary display screen 140 is located between the first audio device 151 and the second audio device 152. It will be understood that, a partition plate assembly composed of two partition plates GB may be disposed in the region enclosed by the first vertical beam SL1, the second vertical beam SL2, the third horizontal beam HL3 and the fourth horizontal beam HL4 with reference to FIG. 7. The partition plates GB are used to separate the audio devices (the first audio device 151 and the second audio device 152) from the auxiliary display screen 140.

The movable base 110J includes a support J1 and a universal wheel assembly J2 disposed at a bottom of the support J1. The shape of the support J1 may be various. For example, the support J1 may be an I-shaped support J1, and the I-shaped support J1 is provided with positioning groove(s) for supporting the fifth horizontal beam HL5.

As shown in FIG. 2, in the case where the frame 110 is applied to the multi-screen interactive display device 100 shown in FIG. 2, after the assembly of the multi-screen interactive display device 100 is accomplished, a type of interfaces described above may be disposed on the fifth horizontal beam HL5. In this case, the support J1 should be provided with an avoidance hole to expose the type of interfaces for easy use.

As shown in FIG. 2, after the camera, the first main display screen 131, the second main display screen 132, the first audio device 151, the second audio device 152 and the auxiliary display screen 140 are mounted on the assembled frame 110, in order to further stabilize the first main display screen 131 and the second main display screen 132, the first locking bar SQ1 and the second locking bar SQ2 are fixed to the first vertical beam SL1 and the second vertical beam SL2, and are located between the second horizontal beam HL2 and the third horizontal beam HL3. The first back plate B1 is disposed on the first vertical beam SL1, the second horizontal beam HL2 and the third vertical beam SL3 to seal the back of the first main display screen 131. The second back plate B2 is disposed on the second vertical beam SL2, the second horizontal beam HL2 and the fourth vertical beam SL4 to seal the back of the second main display screen 132. The third back plate B3 is disposed on the first vertical beam SL1, the third horizontal beam HL3, the fourth horizontal beam HL4 and the second vertical beam SL2 to seal the back of the audio assembly 150 and the back of the auxiliary display 140. As shown in FIG. 6, the fourth back plate B4 may be disposed between the first back plate B1, the second back plate B2, and the third back plate B3. In this case, an upper side of the fourth back plate B4 (away from the movable base 110J) is in contact with a lower side of the first back plate B1 (proximate to the movable base 110J) and a lower side of the second back plate B2 (proximate to the movable base 110J), a lower side of the fourth back plate B4 (proximate to the movable base 110J) is fixed with the third horizontal beam HL3, a left side of the fourth back plate B4 (a side proximate to the first vertical beam SL1) is fixed with the first vertical beam SL1, and a right side of the fourth back plate B4 (a side proximate to the second vertical beam SL2) is fixed with the second vertical beam SL2. On this basis, the fourth back plate B4 may seal the back of the first main display screen 131 and the back of the second main display 132 together with the first back plate B1 and the second back plate B2.

As shown in FIGS. 5 to 7 and 9, by analyzing fixing manners of the horizontal beam assembly 110H, the vertical beam assembly 110S and the back plate assembly 110B, it is found that the section extension direction of each profile section 20 in the embodiments of the present disclosure is provided with the first groove(s) JZ. Therefore, various adapter assemblies may be flexibly disposed, added or adjusted in the first groove(s) according to actual conditions to implement or assist in accomplishing the following three fixing manners, thereby ensuring that components that need to be fixed are firmly fixed to the frame, and improving the fixing reliability.

In a first fixing manner, in a case where the first back plate B1 is disposed on the first vertical beam SL1, the second horizontal beam HL2 and the third vertical beam SL3, a side face of the first back plate B1 is in contact with a beam extension surface of the first vertical beam SL1, a beam extension surface of the second horizontal beam HL2, and a beam extension surface of the third vertical beam SL3. In a case where the second back plate B2 is disposed on the second vertical beam SL2, the second horizontal beam HL2 and the fourth vertical beam SL4, a side face of the second back plate B2 is in contact with the beam extension surface of the second vertical beam SL2, the beam extension surface of the second horizontal beam HL2, and a beam extension surface of the fourth vertical beam SL4. In a case where the third back plate B3 is disposed on the first vertical beam SL1, the third horizontal beam HL3, the fourth horizontal beam HL4 and the second vertical beam SL2, a side face of the third back plate B2 is in contact with the beam extension surface of the first vertical beam SL1, a beam extension surface of the third horizontal beam HL3, a beam extension surface of the fourth horizontal beam HL4, and the beam extension surface of the second vertical beam SL2. In a case where the fourth back plate B4 is disposed between the first back plate B1, the second back plate B2, and the third back plate B3, a side face of the fourth back plate B4 is in contact with the beam extension surface of the first vertical beam SL1, the beam extension surface of the second vertical beam SL2, and the beam extension surface of the third horizontal beam HL3.

Figure 8:
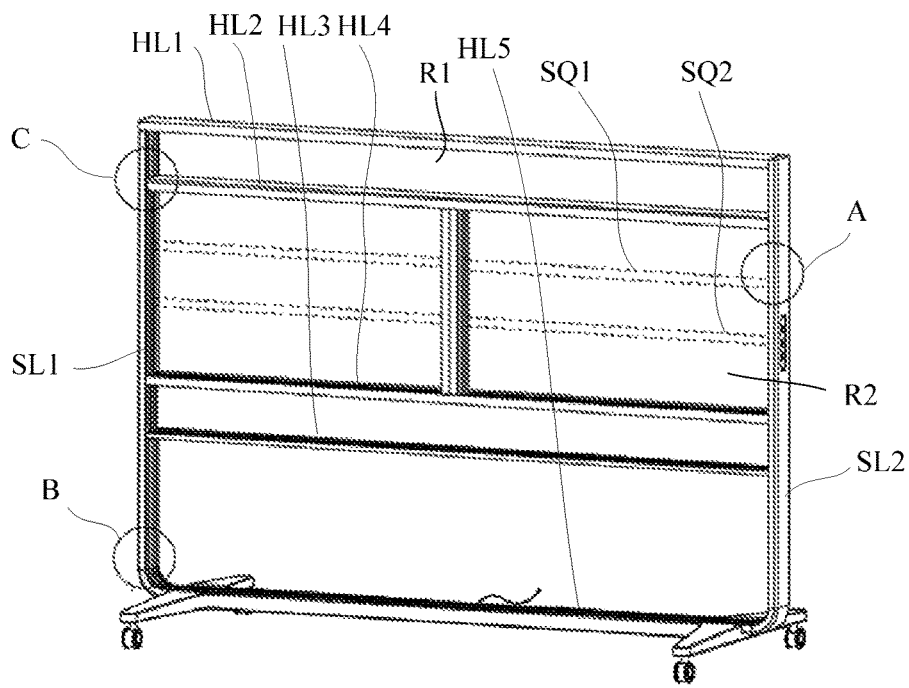
FIG. 8 is a second schematic diagram showing a structure of a frame, in accordance with embodiments of the present disclosure.

In order to avoid influence of the partition beams GD on the fourth back plate B4, the fourth back plate B4 may be divided into two sub-back plates. One sub-back plate of the two is in contact with the beam extension surface of the first vertical beam SL1 and the beam extension surface of the third horizontal beam HL3, and forms a back plate together with the first back plate B1 to seal the back of the first main display screen 131. The other sub-back plate of the two is in contact with the beam extension surface of the second vertical beam SL2 and the beam extension surface of the third horizontal beam HL3, and forms a back plate with the second back plate B2 to seal the back of the second main display screen 132. In a case where the first locking bar SQ1 and the second locking bar SQ2 are fixed with the first vertical beam SL1 and the second vertical beam SL2, a first end of the first locking bar SQ1 and a first end of the second locking bar SQ2 are in contact with the beam extension surface of the first vertical beam SL1, a second end of the first locking bar SQ1 and a second end of the second locking bar SQ2 are in contact with the beam extension surface of the second vertical beam SL2. A first position A in FIGS. 7 and 8 represents a manner in which the beam extension surface of the second vertical beam SL2 is in contact with the side face of the fourth back plate B4. It will be understood that, this fixing manner is also applicable to a process of fixing the image capture device to the first horizontal beam HL1, or other similar processes, which will not be repeated herein.

In a second fixing manner, in a case where the first vertical beam SL1 is fixed with the first end of the fifth horizontal beam HL5 through the first arc-shaped connector HX1, a lower end face of the first vertical beam SL1 is in contact with an end face of the first arc-shaped connector HX1, and an end face of the first end of the fifth horizontal beam HL5 is in contact with an opposite end face of the first arc-shaped connector HX1. In a case where the second vertical beam SL2 is fixed with the second end of the fifth horizontal beam HL5 through the second arc-shaped connector HX2, a lower end face of the second vertical beam SL2 is in contact with an end face of the second arc-shaped connector HX2, and an end face of the second end of the fifth horizontal beam HL5 is in contact with an opposite end face of the second arc-shaped connector HX2. A second position B in FIGS. 7 and 8 represents a contact position of the lower end face of the first vertical beam SL1 and the end face of the first arc-shaped connector HX1. It will be understood that, in this fixing manner, the bottom of the first groove JZ in the vertical beam and the bottom of the first groove JZ in the arc-shaped connector are joined together at the contact position. Similarly, the bottom of the first groove JZ in the horizontal beam and the bottom of the first groove JZ in the arc-shaped connector are joined together at the contact position.

In a third fixing manner, in a case where the first vertical beam SL1 is fixed with the first end of the first beam HL1, the first end of the second beam HL2, the first end of the third beam HL3 and the first end of the fourth beam HL4, an upper end face of the first vertical beam SL1 is in contact with a beam extension surface of the first horizontal beam HL1, the beam extension surface of the first vertical beam SL1 is in contact with an end face of the first end of the second horizontal beam HL2, an end face of the first end of the third horizontal beam HL3 and an end face of the first end of the fourth horizontal beam HL4. In a case where the second vertical beam SL2 is fixed with the second end of the first horizontal beam HL1, the second end of the second horizontal beam HL2, the second end of the third horizontal beam HL3 and the second end of the fourth horizontal beam HL4, an upper end face of the second vertical beam SL2 is in contact with the beam extension surface of the first horizontal beam HL1. The beam extension surface of the second vertical beam SL2 is in contact with an end face of the second end of the second horizontal beam HL2, an end face of the second end of the third horizontal beam HL3 and an end face of the second end of the fourth horizontal beam HL4. A third position C in FIGS. 7 and 8 represents a contact position of the beam extension surface of the first vertical beam SL1 and the end face of the first end of the second horizontal beam HL2. It will be understood that, in this fixing manner, the bottom of the first groove JZ in the horizontal beam and the bottom of the first groove JZ in the vertical beam cannot engage at the contact position.

With respect to the three fixing manners, same adapter assemblies or different adapter assemblies may be used. The adapter assembly and some assemblies matched with the adapter assembly, which are used in the three fixing manners, will be described below according to different fixing manners.

With respect to the first fixing manner, as shown in FIG. 10, each first adapter assembly 190A further includes at least one position-limiting post XZ. The position-limiting post XZ may be a screw or a position-limiting member with any other structure. The at least one position-limiting post XZ fixes the first position-limiting block XK1 in a first groove JZ.

For example, the first position-limiting block XK1 is placed into the first groove JZ (with respect to a process of placing the first position-limiting block XK1 into the first groove JZ, reference may be made to the foregoing description, which will not be repeated herein), and the position-limiting block XK1 is fixed in the first groove JZ by using the at least one position-limiting post XZ, so as to avoid a problem of unstable fixing caused by deviation of the first position-limiting block XK1 in the first groove JZ.

In one example, as shown in FIG. 10, a shape of the first position-limiting block XK1 may be matched with a structure and a shape of the first groove JZ, or may be set according to actual conditions. In a case where a volume of the first position-limiting block XK1 is small, the position-limiting post XZ cannot completely fix the first position-limiting block XK1 in the first groove JZ. To address this problem, the first groove JZ includes an opening and a bottom. When the first position-limiting block XK1 is fixed in the first groove JZ, the at least one position-limiting post XZ abuts against the bottom of the first groove JZ. It will be understood that, the description that the at least one position-limiting post XZ abuts against the bottom of the first groove JZ may mean that the position-limiting post XZ has entered the bottom of the first groove JZ, or may mean that the position-limiting post(s) XZ are in a state of pressing the bottom of the first groove JZ.

In order to further ensure stability of the first position-limiting block XK1 in the first groove JZ, the first position-limiting block XK1 abuts against a part of a side wall of the first groove JZ (where the first position-limiting block XK1 is located) proximate to the opening. In this case, an end of the first position-limiting block XK1 away from the bottom of the first groove JZ abuts against the part of the side wall of the first groove JZ proximate to the opening.

For example, as shown in FIG. 12, in a case where a position-limiting post XZ is a set screw, and a top entry end of the set screw is a tip, during the assembly of the frame, when the first position-limiting block XK1 reaches a target position, and the set screw is screwed into the first position-limiting block XK1 and penetrates a surface of the first position-limiting block XK1 proximate to the bottom of the first groove JZ, the tip of the set screw abuts against the bottom of the first groove JZ, and presses the bottom of the first groove JZ. In this case, the set screw is subjected to an action force of the bottom of the first groove JZ, and transmits the action force to the first position-limiting block XK1. This action force may be referred to as a jacking force, and is directed towards the opening of the first groove JZ. Under action of the jacking force, the first position-limiting block XK1 gradually moves to the opening of the first groove JZ in a direction in which a depth of the first groove JZ decreases until the first position-limiting block XK1 abuts against the part of the side wall of the first groove JZ (where the first position-limiting block XK1 is located) proximate to the opening. In this way, it is possible to ensure that the first position-limiting block XK1 is stuck in the first groove JZ and will not deviate in the first groove JZ.

For example, as shown in FIG. 12, the first position-limiting block XK1 has an edge abutting surface DM. A width of the first groove JZ gradually increases in a direction in which the depth of the first groove JZ increases.

When the frame 110 is assembled, and the first position-limiting block XK1 is fixed in the first groove JZ, the edge abutting surface DM abuts against the part of the side wall of the first groove JZ proximate to the opening. For example, when the edge abutting surface DM has a chamfer structure, a width of a section of the first groove JZ gradually decreases in a direction approaching the opening.

As shown in FIG. 12, in a case where the width of the first groove JZ gradually increases in the direction in which the depth of the first groove JZ increases, the first groove JZ includes a position-limiting region XQ and an accommodating region SQ in the direction in which the depth of the first groove JZ increases. A width of the position-limiting region XQ gradually increases in the direction in which the depth of the first groove JZ increases; a width of the accommodating region SQ remains unchanged. When the frame is in the assembled state, the first position-limiting block XK1 abuts against a side wall of the position-limiting region XQ.

As shown in FIGS. 9 to 11, when the first groove JZ penetrates the end of the profile section 20, the first position-limiting block XK1 may be placed into the first groove JZ from the end of the profile section 20. As long as it is ensured that a thickness b of the first position-limiting block XK1 is less than a width of the opening of the groove, and a width c of the first position-limiting block is matched with the width of the first groove, it may be ensured that the first position-limiting block XK1 will not come out of the first groove JZ.

As shown in FIGS. 10 and 12, the first position-limiting block XK1 is placed into the first groove JZ from the opening of the first groove JZ. The thickness b of the first position-limiting block XK1 is less than a minimum width of the first groove JZ; the width c of the first position-limiting block XK1 is less than a maximum width of the first groove JZ. When the frame is in the assembled state, a thickness direction of the first position-limiting block XK1 is perpendicular to a width direction of the opening of the first groove JZ, and a width direction of the first position-limiting block XK1 is the same as a width direction of the first groove JZ.

As shown in FIGS. 10 to 12, when the first position-limiting block XK1 is mounted in the first groove JZ from the opening of the first groove JZ, since the thickness b of the first position-limiting block XK1 is less than the minimum width of the first groove JZ, the first position-limiting block XK1 may be sideways placed in the first groove JZ. Since the width c of the first position-limiting block XK1 is less than the maximum width of the first groove JZ, there is enough space in the first groove JZ for the first position-limiting block XK1 to turn to the normal position in the first groove JZ, thereby mounting the first position-limiting block XK1 in the first groove JZ from the opening of the first groove JZ.

For example, as shown in FIG. 12, an end of the position-limiting post XZ may further be provided with a screw groove. When the frame is assembled, the position-limiting post XZ is screwed into the first position-limiting block XK1 by using a tool such as a screwdriver which is snapped into the screw groove, and penetrates the first position-limiting block XK1 and enters the bottom of the first groove JZ. In addition, the bottom of the first groove may further be provided with a position-limiting hole, so that an end of the position-limiting post XZ proximate to the bottom of the first groove JZ extends into the profile section to further enhance position-limiting effect of the position-limiting post XZ, thereby ensuring that the first position-limiting block XK1 may be accurately fixed in the first groove JZ.

As shown in FIG. 10, in order to cooperate with the at least one position-limiting post XZ to fix the first position-limiting block XK1 in the first groove JZ, the first position-limiting block XK1 further includes at least one position-limiting through hole WT. That is, the first position-limiting block XK1 is provided with at least one position-limiting through hole WT therein. When the position-limiting block XK1 is fixed in the first groove JZ by using the at least one position-limiting post XZ, the at least one position-limiting post XZ fixes the first position-limiting block XK1 in the first groove JZ through at least one corresponding position-limiting through hole WT.

In an example, as shown in FIGS. 9 to 12, after the assembly of the frame is accomplished, an extending direction of the at least one position-limiting through hole WT included in the first position-limiting block XK1 is the same as a depth direction of the first groove JZ where the first position-limiting block XK1 is located. In this case, the camera, the locking bars, the back plates and other components may be fixed at any positions of the horizontal beams, the vertical beams and the arc-shaped connectors where the first grooves JZ are provided. Moreover, a length a of the position-limiting post XZ is controlled, so that when the at least one position-limiting post XZ fixes the first position-limiting block XK1 in the first groove JZ, an end face of the position-limiting post XZ away from the bottom of the first groove JZ are flush with a surface of the first position-limiting block XK1 away from the bottom of the first groove JZ, or the position-limiting post XZ is located in the position-limiting through hole WT disposed in the first position-limiting block XK1. It will be understood that, both the position-limiting through hole WT and the first mounting hole AK1 may be threaded holes with internal threads, and specifications of the threaded holes may be the same to ensure that the position-limiting through hole WT may be used as the first mounting hole AK1 in some cases, and the first mounting hole AK1 may be used as the position-limiting through hole in some cases.

In addition, as shown in FIGS. 10 and 11, the number and position of the position-limiting posts XZ and the number and position of the position-limiting through holes WT may be determined according to actual conditions. For example, there may be one or more position-limiting posts XZ and one or more position-limiting through holes WT. The position-limiting through hole WT may be arranged on a side or in the middle of the first position-limiting block XK1 according to actual conditions. Therefore, when the frame is in the assembled state, the position-limiting post XZ may be disposed on a side of the first position-limiting block XK1, or may be disposed in the middle of the first position-limiting block XK1. There may be one or more position-limiting posts XZ and one or more position-limiting through holes WT. In a case where there are a plurality of position-limiting posts XZ and a plurality of position-limiting through holes WT, position-limiting capacity of the position-limiting block XK1 in the first groove JZ may be further improved. However, it will be noted that, in the case where there are a plurality of position-limiting posts XZ and a plurality of position-limiting through holes WT, the plurality of position-limiting posts XZ should be evenly disposed on the first position-limiting block XK1 to avoid a deflection problem caused by uneven force on the first position-limiting block XK1.

FIG. 10 shows that the first position-limiting block XK1 is provided with two first mounting holes AK1 and one position-limiting through hole WT. As shown in FIG. 11, the position-limiting through hole WT is located in the middle of the two first mounting holes AK1 to avoid the deflection of the first position-limiting block XK1 caused by uneven distribution of the jacking force when the position-limiting post XZ abuts against the bottom of the first groove JZ. Of course, the position-limiting through hole WT may also be located at a side of the two first mounting holes AK1.

As shown in FIG. 11, in a case where there are a plurality of first mounting holes AK1 disposed in the first position-limiting block XK1, a distance between two adjacent first mounting holes may be set according to actual conditions. For example, in a case where a component to be installed by the first adapter assembly 190A is provided with two assembly holes with a large distance therebetween, there are two first mounting hole AK1 disposed in the first position-limiting block XK1, and a distance between the two mounting holes AK1 is the same as a distance between the two assembly holes, thereby ensuring that the component to be installed may be accurately fixed to the frame through the first adapter assembly 190A.

In addition, as shown in FIG. 11, in a case where the component to be installed by the first adapter assembly 190A is provided with a number of assembly holes, or although only two assembly holes are disposed, the distance between the two assembly holes is very large, the first position-limiting block XK1 included in one adapter assembly 190A cannot be aligned with the assembly holes. In this case, first position-limiting blocks XK1 included in two or more first adapter assemblies 190A may be used in combination to fix the component to the frame. Of course, a distance between the first position-limiting blocks XK1 included in the two or more first adapter assemblies 190A may be adjusted, so that first mounting holes AK1 disposed in the first position-limiting blocks XK1 are aligned with the assembly holes of the component, thereby ensuring that the component may be accurately fixed to the frame.

In an example, as shown in FIGS. 5 to 8, with respect to the first horizontal beam HL1, the image capture device 120 such as the camera is installed on the first beam HL1 through one or more first adapter assemblies 190A. As shown in FIG. 11, the first position-limiting block XK1 included in the first adapter assembly 190A is stuck in the first groove JZ of the first horizontal beam HL1, and thus the image capture device 120 such as the camera may be firmly mounted to the first horizontal beam HL1 through the first adapter assembly 190A.

In another example, as shown in FIGS. 5 to 10, in a case where the frame includes the back plate assembly 110B, if the frame is in the assembled state, side edges of the back plates included in the back plate assembly 110B are fixed with at least one profile section 20 through the first position-limiting block XK1 included in at least one first adapter assembly 190A. That is to say, the side edges of the back plates included in the back plate assembly 110B may be fixed with the at least one profile section 20 by using first mounting hole(s) AK1 disposed in the first position-limiting block XK1 included in the first adapter assembly 190A. It will be understood that, the back plates included in the back plate assembly 110B herein are back plates in a broad sense, which not only refer to the first back plate B1, the second back plate B2, the third back plate B3 and the fourth back plate shown in FIG. 5, but also refer to the first locking bar SQ1 and the second locking bar SQ2 shown in FIG. 5. For example, when the first locking bar SQ1 and the second locking bar SQ2 are fixed to the first vertical beam SL1 and the second vertical beam SL2, flanges may be disposed at two ends of the first locking bar SQ1 and two ends of the second locking bar SQ2, and screw holes are disposed in the flanges. After the screw holes disposed in the flanges of the first locking bar SQ1 and the second locking bar SQ2 are aligned with the first mounting holes AK1 disposed in the first position-limiting blocks XK1, the two ends of the first locking bar SQ1 and the two ends of the second locking bar SQ2 are fixed with the first vertical beam SL1 and the second vertical beam SL2 by using connectors such as screws or bolts.

With respect to the second fixing manner and the third fixing manner, the second fixing manner and the third fixing manner are substantially used to fix the horizontal beams (which are profile sections) and the vertical beams (which are profile sections). In this case, as shown in FIGS. 13 to 17, the frame further includes at least one second adapter assembly 1906. In this case, the horizontal beam assembly 110H and the vertical beam assembly 110S shown in FIG. 5 are fixed together through the at least one second adapter assembly 190B. On this basis, the plurality of profile sections 20 include a first profile section 21 and a second profile section 22. When the frame is assembled, the second adapter assemblies 190B fix the first profile section 21 and the second profile section 22 together.

As shown in FIG. 9, the second adapter assembly 190B includes a locking sub-assembly and an adapter sub-assembly. The locking sub-assembly includes a first positioning member D1 and a second positioning member D2. The first positioning member D1 is provided with a locking through hole SK. Each adapter sub-assembly further includes a connecting rod LG. Each connecting rod LG is provided with a second groove PC.

As shown in FIGS. 9 and 13 to 17, when the frame is assembled, a depth direction of the locking through hole SK is the same as the depth direction of the first groove JZ, the connecting rod LG is fixed in the first groove JZ of the first profile section, the first positioning member D1 is fixed in the first groove JZ of the second profile section, the connecting rod LG also passes through the locking through hole SK, and the second positioning member D2 passes through the locking through hole SK and the second groove PC to fix the connecting rod LG to the first positioning member D1, so that the first profile section 21 and the second profile section 22 are fixed together.

As shown in FIGS. 13 to 17, the first positioning member D1 is provided with a sleeve through hole DK communicating with the locking through hole SK. When the frame is assembled, the connecting rod LG passes through the locking through hole SK through the sleeve through hole DK, and then the second groove PC is located in the locking through hole SK, so that the locking through hole SK is connected with the second groove PC.

For example, in a case where a depth direction of the second groove PC disposed in the connecting rod LG is perpendicular to an axial direction of the connecting rod LG, a depth direction of the sleeve through hole DK disposed in the first positioning member D1 is perpendicular to the depth direction of the locking through hole SK. When the frame is assembled, the depth direction of the sleeve through hole DK is parallel to the axial direction of the connecting rod LG, and the depth direction of the locking through hole SK disposed in the first positioning member D1 should be parallel to the depth direction of the second groove PC.

In an example, as shown in FIGS. 5 to 8 and 13 to 15, in a case where the first profile section 21 is the first vertical beam SL1 or the fifth horizontal beam HL5, and the second profile section 22 is the first arc-shaped connector HX1 or the second arc-shaped connector HX2, the first profile section 21 and the second profile section 22 are fixed together in the second fixing manner. The first profile section 21 and the second profile section 22 are fixed together, and the bottom of the first groove JZ of the first profile section 21 and the bottom of the first groove JZ of the second profile section 22 should be joined together, so that an end face of the first profile section 21 and an end face of the second profile section 22 are joined. In a case where the number of the first grooves JZ of the first profile section 21 is equal to the number of the first grooves JZ of the second profile section 22, the bottom(s) of the first groove(s) JZ of the first profile section 21 and the bottom(s) of the first groove(s) JZ of the second profile section 22 are joined in one-to-one correspondence, which may reduce a degree of misalign between the end face of the first profile section 21 and the end face of the second profile section 22 that are to be joined.

Figure 13:
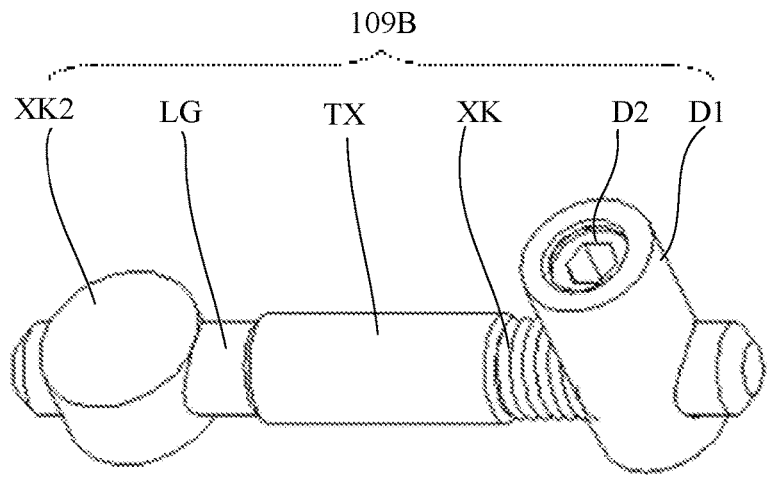
FIG. 13 is a schematic diagram showing an assembled state of a second adapter assembly that achieves a second fixing manner, in accordance with embodiments of the present disclosure.
Figure 14:
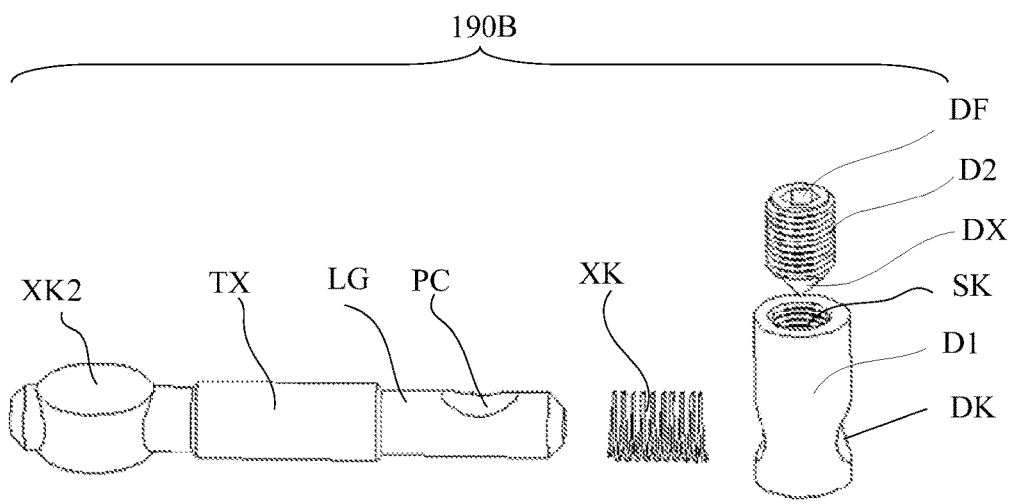
FIG. 14 is an exploded view of the second adapter assembly in FIG. 13.
Figure 15:
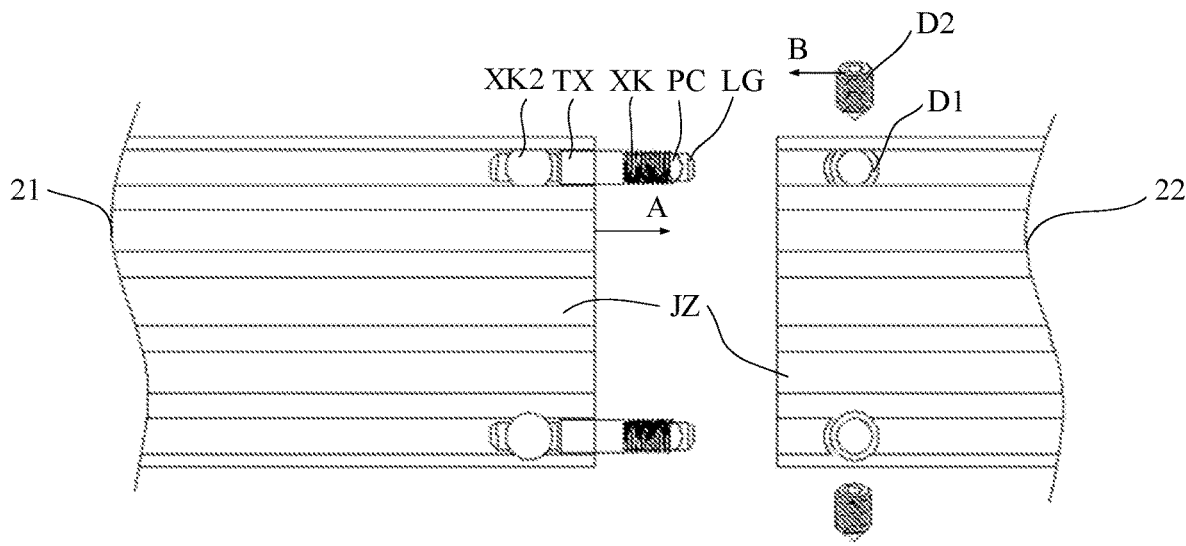
FIG. 15 is a schematic diagram of an application scenario of the second adapter assembly shown in FIG. 13.

After the assembly of the frame is accomplished, as shown in FIGS. 13 to 15, when the connecting rod LG passes through the locking through hole SK, the connecting rod LG extends out of the first profile section 21 in a section extension direction of the first profile section 21. The end face of the first profile section 21 is in contact with the end face of the second profile section 22. In this case, the end face of the first profile section 21 is a connecting end face of the first profile section 21, and the end face of the second profile section 22 is a connecting end face of the second profile section 22.

As shown in FIGS. 5 to 8, 16 and 17, in a case where the first profile section 21 is the first vertical beam SL1 or the second vertical beam SL2, and the second profile section 22 is the second horizontal beam HL2, the third horizontal beam HL3 or the fourth horizontal beam HL4, the first profile section 21 and the second profile section 22 are fixed together in the third fixing manner. After the assembly of the frame is accomplished, when the connecting rod LG passes through the locking through hole SK, the connecting rod LG extends out of the first profile section 21 from the opening of the first groove JZ in a depth direction of the first groove JZ of the first profile section 21. A section extension surface of the first profile section 21 is in contact with the end face of the second profile section 22, so that the opening(s) of the first groove(s) JZ are in contact with the end face of the second profile section 22. That is to say, the section extension surface of the first profile section 21 is the connecting end face of the first profile section 21, and the end face of the second profile section 22 is the connecting end face of the second profile section 22.

Similarly, as shown in FIGS. 5 to 8, 16 and 17, in a case where the first profile section 21 is the first horizontal beam HL1, and the second profile section 22 is the first vertical beam SL1 or the second vertical beam SL2, the first profile section 21 and the second profile section 22 are also fixed together in the third fixing manner. In a case where the first profile section 21 is the second horizontal beam HL2 or the third horizontal beam HL3, and the second profile section 22 is the third vertical beam SL3 or the fourth vertical beam SL4, the first profile section 21 and the second profile section 22 are also fixed together in the third fixing manner.

It will be noted that, as shown in FIGS. 13 to 17, the second adapter assembly 190B further includes a second position-limiting block XK2. The second position-limiting block XK2 is provided with a second mounting hole. When the frame is assembled, the second mounting hole fixes the connecting rod LG in the first groove JZ disposed in the first profile section 21.

Figure 16:
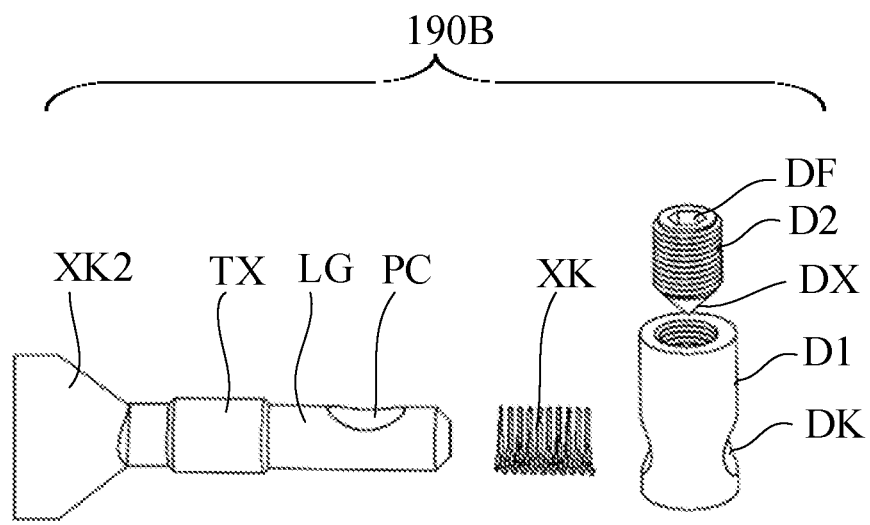
FIG. 16 is an exploded view of a second adapter assembly that achieves a third fixing manner, in accordance with embodiments of the present disclosure.

With respect to the second fixing manner, as shown in FIGS. 13 to 15, a depth direction of the at least one second mounting hole disposed in the second position-limiting block XK2 is the same as the section extension direction of the first profile section 21 where the second position-limiting block XK2 is located, so that when the connecting rod LG passes through the locking through hole SK, the connecting rod LG extends out of the first profile section 21 in the section extension direction of the first profile section 21. As shown in FIGS. 16 and 17, with respect to the third fixing manner, the depth direction of the at least one second mounting hole disposed in the second position-limiting block XK2 is the same as the depth direction of the first groove JZ, so that when the connecting rod LG passes through the locking through hole SK, the connecting rod LG extends out of the first profile section 21 from the opening of the first groove JZ in the depth direction of the first groove JZ of the first profile section 21.

As shown in FIGS. 13 to 17, the second position-limiting block XK2 has various shapes. For example, with respect to the second fixing manner, as shown in FIGS. 13 to 15, the second position-limiting block XK2 may have a pie-shaped structure. With respect to the third fixing manner, as shown in FIGS. 16 and 17, an end of the second position-limiting block XK2 facing the opening of the first groove JZ has a chamfer.

In addition, as shown in FIGS. 16 and 17, the second position-limiting block XK2 is easy to come out of the end face of the first profile section 21, and the first positioning member D1 is easy to come out of the end face of the second profile section 22. Therefore, after the assembly of the frame is accomplished, the second position-limiting block XK2 is stuck in the first groove JZ, and the second position-limiting block XK2 is prevented from coming out of the end face of the first profile section 21. The first positioning member D1 should also be stuck in the first groove JZ, and the second position-limiting block XK2 is prevented from coming out of the end face of the second profile section 22.

For example, as shown in FIGS. 13 to 17, the second position-limiting block XK2 may further be fixed in the first groove JZ disposed in the first profile section 21 with reference to a structure of the first position-limiting block XK1 shown in FIG. 10.

For another example, as shown in FIGS. 13 to 17, position-limiting pit(s) are disposed in a side wall of the first groove JZ disposed in the first profile section 21, so that the second position-limiting block XK2 is stuck in the position-limiting pit. Of course, position-limiting pit(s) may be disposed in a side wall of a first groove JZ disposed in the second profile section 22, so that the first positioning member D1 is stuck in the first groove JZ.

As shown in FIGS. 15 to 17, with respect to the first profile section 21, at least one first groove JZ of the first profile section 21 is used to arrange the connecting rod LG shown in FIG. 14 or 16. That is to say, one or more first grooves JZ of the first profile section 21 may be used to fix connecting rod(s) LG, and in the first groove JZ of the first profile section 21 that is used to fix the connecting rod(s) LG, the number of the fixed connecting rods LG may be set according to actual conditions.

As shown in FIGS. 15 and 17, with respect to the second profile section 22, at least one first groove JZ of the first profile section 22 is used to arrange the first positioning member D1 shown in FIG. 14 or 16. That is to say, one or more first grooves JZ of the second profile section 22 may be used to fix first positioning member(s) D1, and in the first groove JZ of the second profile section 22 that is used to fix the first positioning member(s) D1, the number of the fixed first positioning members D1 may be set according to actual conditions.

A process of fixing the first profile section 21 and the second profile section 22 together will be described below with reference to FIGS. 13 to 17. The following description is only for explanation and not for limitation.

In a first step, the connecting rod LG is fixed in the first groove JZ of the second position-limiting block XK2, and it is ensured that an end of the connecting rod LG provided with the second groove PC extends out of the first groove JZ, and the first positioning member D1 is fixed in the second profile section 22. As shown in FIGS. 5 and 13 to 15, in a case where the first profile section 21 and the second profile section 22 are fixed together in the second fixing manner, the depth direction of the second mounting hole AK1 disposed in the second position-limiting block XK2 is the same as the section extension direction of the first profile section 21. Therefore, the connecting rod LG mounted in the second mounting hole extends out of the first groove JZ in the section extension direction of the first profile section 21. As shown in FIGS. 5, 16 and 17, in a case where the first profile section 21 and the second profile section 22 are fixed together in the third fixing manner, since the depth direction of the second mounting hole AK1 disposed in the second position-limiting block XK2 is the same as the depth direction of the first groove JZ, the connecting rod LG extends out of the first groove JZ from the opening of the first groove JZ.

In a second step, an end of the connecting rod LG extending out of the first groove JZ extends into the first groove JZ disposed in the second profile section 22 from the connecting end face of the second profile section 22 (an extending direction being a direction of first arrow A shown in FIG. 15), and it is ensured that the connecting rod LG passes through the locking through hole SK disposed in the first positioning member D1, so that the locking through hole SK is connected with the second groove PC.

In a third step, the second positioning member D2 is fixed in the second groove PC through the locking through hole SK, thereby ensuring that an end of the connecting rod LG (which is disposed in the first profile section 21) extending out of the first profile section 21 is positioned in the second profile section 22 by the second positioning member D2.

As will be seen from the above, as shown in FIGS. 13 to 17, by using the first groove(s) JZ in the first profile section 21 and the first groove(s) JZ in the second profile section 22 to hide locking sub-assemblies and adapter sub-assemblies, it is possible to ensure that there are no fixing marks on a joint surface of the first profile section 21 and the second profile section 22 when the first profile section 21 and the second profile section 22 are fixed together, thereby improving the use experience of the multi-screen interactive display device.

It will be noted that, as shown in FIGS. 10 to 15, a distance between the first positioning member D1 and the connecting end face of the second profile section 22 may be adjusted according to actual conditions, so as to control a contact gap between the connecting end face of the first profile section 21 and the connecting end face of the second profile section 22. For example, in a case where the distance between the first positioning member D1 and the connecting end face of the second profile section 22 is large, the contact gap between the connecting end face of the first profile section 21 and the connecting end face of the second profile section 22 is wide. In a case where the distance between the first positioning member D1 and the connecting end face of the second profile section 22 is small, the contact gap between the connecting end face of the first profile section 21 and the connecting end face of the second profile section 22 is narrow.

In another example, as shown in FIGS. 13 to 17, the second adapter assembly 190B further includes a position-limiting spring XK. The locking sub-assembly further includes a position-limiting sleeve TX.

When the frame is assembled, the position-limiting sleeve TX is sleeved on the connecting rod LG, and the position-limiting spring XK is sleeved on the connecting rod LG. When the second positioning member D2 fixes the connecting rod LG to the first positioning member D1, the position-limiting spring XK is located between the position-limiting sleeve TX and the second positioning member D2 and is in a compressed state. It will be seen that, when the first positioning member D1 is sleeved on the connecting rod LG, the position-limiting spring XK ensures that the first positioning member D1 does not pass over the second groove PC, so as to facilitate accurate alignment of the locking through hole SK in the first positioning member D1 with the second groove PC, so that the second positioning member D2 may be quickly stuck in the second groove PC.

For example, the position-limiting spring XK includes a first end and a second end. When the position-limiting spring XK is in a free state, the first end of the position-limiting spring XK abuts against the position-limiting sleeve TX, and the second end of the position-limiting spring XK is located in a region enclosed by an edge of the opening of the second groove PC. In this case, the second end of the position-limiting spring XK extends in an extending direction of the connecting rod LG beyond an edge of the opening of the second groove PC that is proximate to the position-limiting sleeve TX and not beyond an edge of the opening of the second groove PC that is away from the position-limiting sleeve TX.

Taking the second fixing manner as an example, a process in which the second positioning member D2 is stuck in the second groove PC with assistance of the position-limiting spring XK will be described below with reference to FIGS. 13 to 15. With respect to a principle in which the second positioning member D2 is stuck in the second groove PC in the third fixing manner, reference may also be made to the following description, which will not be described in detail.

In an initial state, an end of the connecting rod LG is disposed in the second mounting hole of the second position-limiting block XK2, and the position-limiting spring XK is sleeved on the connecting rod LG and is in a free state. The first positioning member D1 is disposed in the second profile section 22. In a case where the second profile section 22 is in a stationary state, the first profile section 21 moves towards the second profile section 22 in the direction of the first arrow A shown in FIG. 15, so that the connecting end face of the first profile section 21 gradually approaches the connecting end face of the profile section 22. In this process, before the end of the connecting rod LG provided with the second groove PC extends into the second profile section 22, the position-limiting spring XK is in the free state, and blocks part or all of a region of the opening of the second groove PC. After the end of the connecting rod LG provided with the second groove PC extends into the first groove JZ of the second profile section 22, the first positioning member D1 is gradually sleeved on the connecting rod LG, so that the connecting rod LG passes through the locking through hole SK disposed in the first positioning member D1.

When the first positioning member D1 is gradually sleeved on the connecting rod LG, and an outer surface of the first positioning member D1 contacts the second end of the position-limiting spring XK, the position-limiting spring XK gradually transits from the free state to the compressed state. Since the position-limiting spring XK is in the free state and blocks part or all of the region of the opening of the second groove PC, when the position-limiting spring XK transits from the free state to the compressed state, the first positioning member D1 may be located at the right side of the second groove PC under blocking of the position-limiting spring XK. When the end of the connecting rod LG provided with the second groove PC continues to move in the direction of the first arrow A shown in FIG. 15, the locking through hole SK disposed in the first positioning member D1 moves in a direction of second arrow B relative to the connecting rod LG. In this process, a distance between the locking through hole SK and the second groove PC is smaller and smaller, and connectivity between the locking through hole SK and the second groove PC is better and better. In addition, in a case where the extent of the movement of the connecting rod LG in the direction of the first arrow A shown in FIG. 15 is excessively large, the position-limiting spring XK may prevent the locking through hole SK disposed in the first positioning member D1 from extending beyond the second groove PC disposed in the connecting rod LG, thereby making it possible that the second positioning member D2 is easily and accurately fixed in the second groove PC through the locking through hole SK.

It will be noted that, as shown in FIGS. 13 to 15, a position of the adapter sub-assembly relative to the first profile section 21 is unchanged, and a position of the first positioning member D1 relative to the second profile section 22 is unchanged. The movement of the first positioning member D1 is caused by a fact that the movement of the first profile section 21 in the direction of the first arrow A shown in FIG. 15 causes the first positioning member D1 to move relative to the connecting rod LG.

For example, as shown in FIGS. 13 to 17, the second groove PC includes an opening and a bottom. A width of the second groove PC gradually decreases in a direction in which the depth of the second groove PC increases. Specifically, as shown in FIGS. 13 to 18, the second groove PC is a tapered groove. When the frame is in the assembled state, the second positioning member D2 includes a tapered end DX. When the tapered end DX of the second positioning member D2 is located in the second groove PC, if the second positioning member D2 has not been locked with the locking through hole SK, the tapered end DX of the second positioning member D2 may further advance in the direction in which the depth of the second groove PC increases. During the advancement, the tapered end DX of the second positioning member D2 applies an oblique downward force FO to a side wall of the second groove PC. Correspondingly, the side wall of the second groove PC applies an oblique upward reaction force F to the tapered end DX of the second positioning member D2. When the tapered end DX of the second positioning member D2 initially extends into the second groove PC, the tapered end DX of the second positioning member D2 substantially contacts a right side wall of the second groove PC. Therefore, when the side wall of the second groove PC applies the oblique upward reaction force F to the tapered end DX of the second positioning member D2, a direction of the reaction force F is directed to the upper left in FIG. 18.

Figure 18:
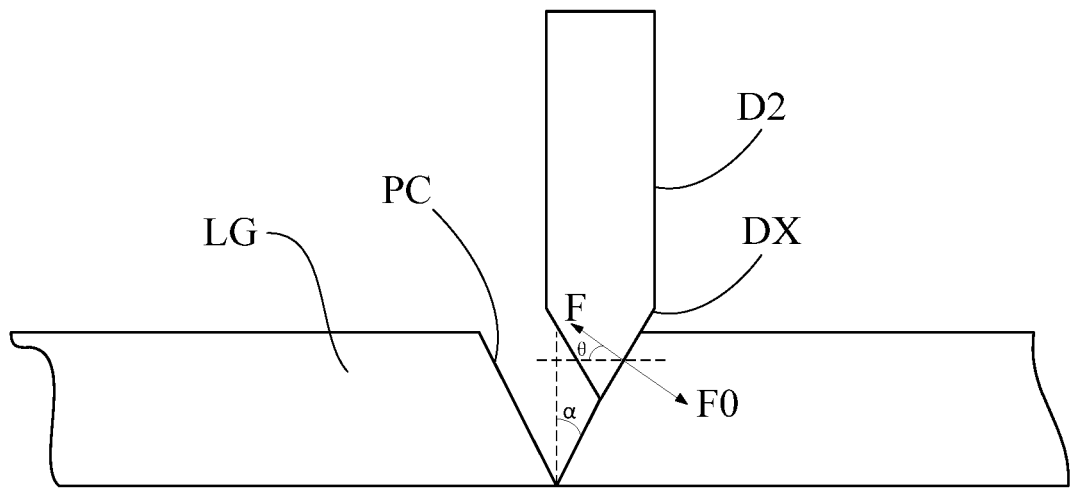
FIG. 18 is a schematic diagram showing interaction between a second positioning member and a second groove, in accordance with embodiments of the present disclosure.
Figure 19:
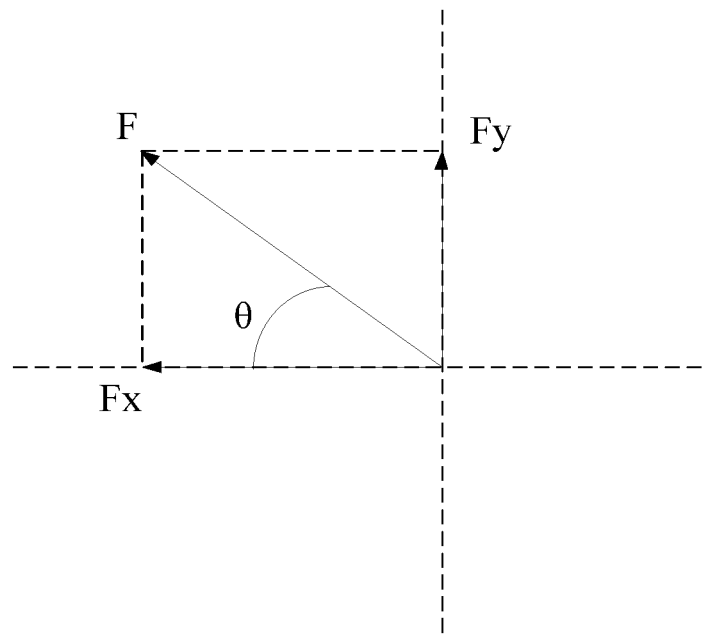
FIG. 19 is a schematic diagram showing a force analysis of a tapered end of a second positioning member, in accordance with embodiments of the present disclosure.

FIG. 19 is a schematic diagram showing a force analysis of the tapered end of the second position-limiting member in some embodiments of the present disclosure. As shown in FIG. 19, Fx is a component force of the reaction force F in a horizontal direction (the horizontal direction being parallel to an axial direction of the connecting rod LG shown in FIG. 18), and a direction thereof is directed to the right side in FIG. 19. Fy is a component force of the reaction force F in a vertical direction (the vertical direction being perpendicular to the axial direction of the connecting rod LG shown in FIG. 18), and a direction thereof is directed to the upper side in FIG. 19. An angle between the reaction force F and the horizontal direction is set to be θ. In this case, Fx=F cos θ, and Fy=F sin θ. It will be seen that, as shown in FIGS. 18 and 19, when the tapered end DX of the second positioning member D2 is subjected to the reaction force F, the second positioning member D2 moves to the left (relative to the connector) under action of the reaction force F. Driven by the second positioning member D2, the first positioning member D1 also moves to the left in FIG. 15 in the axial direction of the connecting rod LG (relative to the connector). When the second positioning member D2 is locked with the locking through hole SK disposed in the first positioning member D1, the tapered end DX of the second positioning member D2 cannot continue to move towards the second groove PC in the direction in which the depth of the second groove PC increases, so that the tapered end DX of the second positioning member D2 is stuck in the second groove PC.

As shown in FIGS. 13 to 19, when the tapered end DX of the second positioning member D2 moves in the direction in which the depth of the second groove PC increases, the side wall of the second groove PC may apply a certain reaction force F to the tapered end DX of the second positioning member D2, thereby driving relative movement between the first positioning member D1 and the second groove PC disposed in the connecting rod LG. In a process in which the first positioning member D1 is locked with the locking through hole SK, the reaction force F may assist the second groove PC to be gradually aligned with the locking through hole SK, so that the tapered end DX of the second positioning member D2 may enter the second groove PC to a greatest extent to ensure that the second positioning member may be reliably fixed in the second groove PC disposed in the connecting rod LG.

As shown in FIG. 18, in a case where the second groove PC is a tapered groove such as a conical groove, and the tapered end DX of the second positioning member D2 is a conical end, an angle α between a height of the conical groove and a generatrix of the conical groove is substantially equal to an angle between the reaction force F and the horizontal direction. Therefore, the angle between the height of the conical groove and the generatrix of the conical groove determines a magnitude of the component force Fx of the reaction force F in the horizontal direction. Since Fx=F cos θ, the smaller the angle between the height of the conical groove and the generatrix of the conical groove, the more advantageous it is for the first positioning member D1 and the second positioning member D2 to move to the left (relative to the connector). In addition, when the tapered end DX of the second positioning member D2 is stuck in the conical groove, an axial direction of the conical groove may coincide with an axis of the conical end, or not.

As shown in FIGS. 13 to 17, in order to facilitate detachment of the second positioning member D2 that is already in a locked state from the locking through hole SK disposed in the first positioning member D1, an end of the second positioning member D2 away from the first groove JZ (hereinafter referred to as a free end of the second positioning member D2) is provided with a disassembly auxiliary groove DF. A shape of the disassembly auxiliary groove DF is various, and the shape thereof is determined according to a disassembly tool used. For example, in a case where the disassembly tool used is a hexagon wrench, the disassembly auxiliary groove is an internal hexagon screw groove. The second positioning member D2 is locked with the locking through hole SK through threads.

It will be noted that, an essential difference between the second fixing manner and the third fixing manner is that the arrangement direction of the second mounting hole is different, which causes that the end face of the first profile section is in contact with the end face of the second profile section in the second fixing manner, and that the opening of the first groove disposed in the section extension surface of the first profile section is in contact with the end face of the second profile section in the third fixing manner. In addition, in the second fixing manner and the third fixing manner, assembly of the locking sub-assembly and the adapter sub-assembly is simple, and strength of the structure is high, so that integrality of the frame including the first profile section and the second profile section is good.

In a specific implementation, profile sections used by the horizontal beams, the vertical beams, and the arc-shaped connectors may be made of aluminum extrusion profiles. It will be understood that, molds for manufacturing the horizontal beams, the vertical beams and the arc-shaped connectors may be adjusted according to subtle differences of the horizontal beams, the vertical beams and the arc-shaped connectors in actual use. For example, if structures and sizes of profile sections used by each horizontal beam and each vertical beam are the same, the profile sections used by each horizontal beam and each vertical beam may be manufactured by using a same mold.

Figure 20:
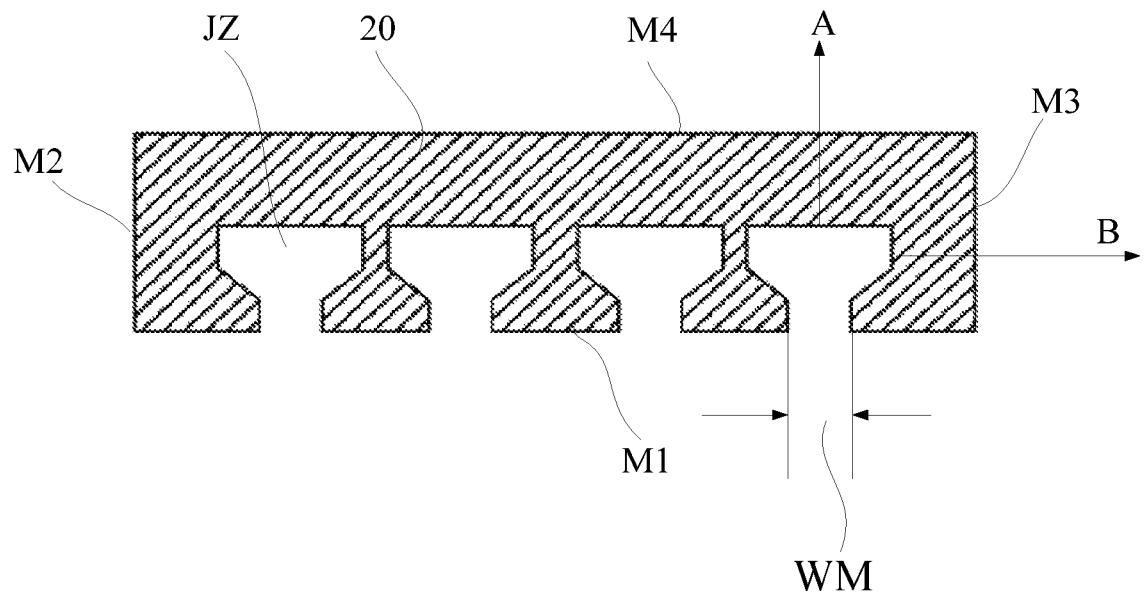
FIG. 20 is a first sectional view taken along line A-A in FIG. 9.

As shown in FIGS. 9 and 20, section extension surfaces of profile sections 20 used by the horizontal beam assembly 110H and the vertical beam assembly 110S shown in FIG. 5 each include a first section extension surface M1, a second section extension surface M2, a third section extension surface M3 and a fourth section extension surface M4, all of which extend in the section extension direction of the profile section 20. The first section extension surface M1 is opposite to (e.g., parallel to) the fourth section extension surface M4, the second section extension surface M2 and the third section extension surface M3 are both adjacent to the first section extension surface M1, and the second section extension surface M2 and the third section extension surface M3 are both adjacent to the fourth section extension surface M4.

As shown in FIGS. 9 and 20, the at least one first groove JZ disposed in each profile section 20 is disposed in the first section extension surface M1. The at least one first groove JZ extends in the section extension direction of the profile section 20. A first groove JZ includes a bottom and an opening. It is defined that the depth direction of the first groove JZ is perpendicular to the extending direction of the first section extension surface M1, and is specifically a direction of arrow A shown in FIG. 20. The width direction of the first groove JZ is parallel to the extending direction of the first section extension surface M1, and is specifically a direction of arrow B shown in FIG. 20. The minimum width of the first groove JZ is shown as WM in FIG. 20.

It will be understood that, as shown in FIG. 9, the profile section 20 includes a first end face and a second end face. The first groove JZ may penetrate the first end face and the second end face of the profile section 20 in the section extension direction of the profile section 20, or penetrate the first end face or the second end face of the profile section 20. Herein, both the first end face and the second end face of the profile section 20 refer to end faces perpendicular to the section extension direction of the profile section 20.

Figure 22:
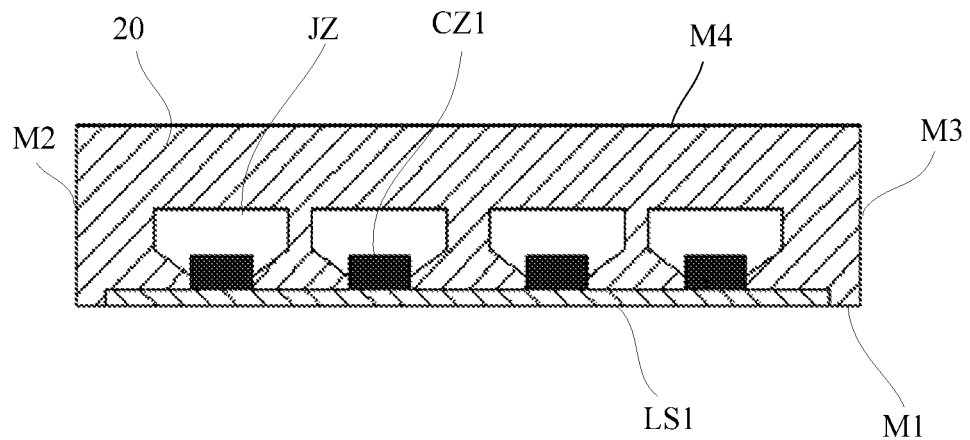
FIG. 22 is a schematic diagram showing an assembled state of the profile section in FIG. 21, a first cover plate assembly, and first magnetic assemblies.

In some embodiments, as shown in FIG. 9, when the frame is assembled by using the profile section 20, the first groove JZ disposed in the profile section 20 may be exposed, affecting the use experience. To this end, as shown in FIG. 22, the frame further includes at least one first cover plate assembly LS1 and at least one first magnetic assembly CZ1. A first cover plate assembly LS1 may be a cover plate made of an iron material that may be attracted by the first magnetic assembly CZ1. When the frame is assembled, the first magnetic assemblies CZ1 are disposed in the first grooves JZ, and the first cover plate assembly LS1 is attracted by the first magnetic assemblies CZ1 to the openings of the first grooves JZ where the first magnetic assemblies CZ1 are located, so that the first cover plate assembly LS1 blocks the exposed openings of the first grooves JZ, and the first cover plate assembly LS1 is prevented from detaching from the openings of the first grooves JZ.

For example, as shown in FIG. 5, the first horizontal beam HL1, the fifth horizontal beam HL5, a portion of the first vertical beam SL1 between the fourth horizontal beam HL4 and the fifth horizontal beam HL5, and a portion of the second vertical beam SL2 between the fourth horizontal beam HL4 and the fifth horizontal beam HL5 are all prone to a problem of exposure of the first groove JZ. In this case, as shown in FIG. 22, the first magnetic assemblies CZ1 may be disposed in the first grooves JZ at these positions, and the first cover plate assembly LS1 may be attracted to the openings of the first grooves JZ by using the first magnetic assemblies CZ1, thereby avoiding the problem of exposure of the first grooves JZ.

For example, as shown in FIG. 22, the first magnetic assembly CZ1 includes at least one magnet. The first cover plate assembly LS1 includes at least one cover plate. The number of magnets included in the first magnetic assembly CZ1 in a same first groove JZ is set according to actual conditions to ensure that one cover plate is attracted to the opening of the first groove JZ by one magnet. In a case where the first magnetic assembly CZ1 includes a plurality of magnets, the plurality of magnets are evenly distributed in the section extension direction of the profile section 20, so that the at least one cover plate may be smoothly attracted to the openings of the first grooves JZ to avoid a problem that the cover plate cannot completely block the first grooves JZ when force that the at least one cover plate is subjected to is uneven.

In actual use, as shown in FIG. 22, when the openings of the first grooves JZ are exposed, regardless of whether the first grooves JZ are disposed in a profile section 20 used by a horizontal beam or a profile section 20 used by a vertical beam, when the frame is assembled, each first groove JZ is provided with one first magnetic assembly CZ1. If a length of the first groove JZ in the section extension direction is large, the number of the magnets included in the first magnetic assembly CZ1 may be appropriately increased, for example, the first magnetic assembly CZ1 includes five magnets. If the length of the first groove JZ in the section extension direction is small, the number of the magnets included in the first magnetic assembly CZ1 may be appropriately reduced, for example, the first magnetic assembly CZ1 includes two magnets. It will be understood that, each cover plate is attracted to the openings of the first grooves JZ by at least one magnet.

Figure 21:
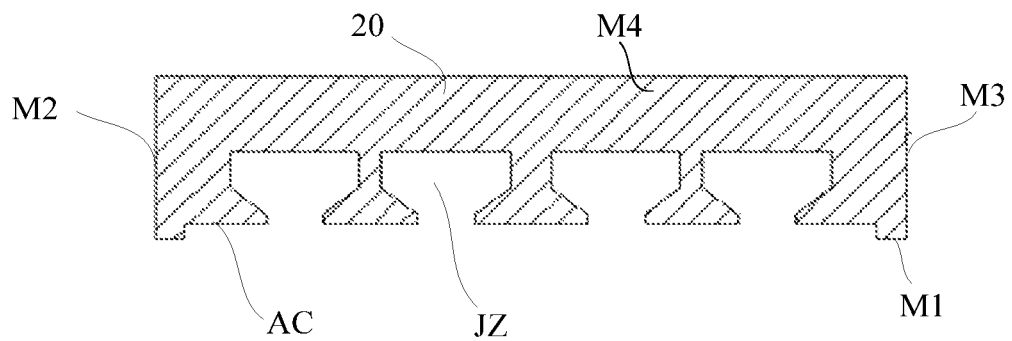
FIG. 21 is a second sectional view taken along line A-A in FIG. 9.

For example, as shown in FIG. 22, when the first cover plate assembly LS1 is attracted to the openings of the first grooves JZ by the first magnetic assemblies CZ1, the first cover plate assembly LS1 is easy to shift when subjected to vibration. To this end, as shown in FIG. 21, the first section extension surface M1 is provided with a third groove AC. The first grooves JZ are disposed at a bottom of the third groove AC. In this case, after the assembly of the frame is accomplished, a side wall of the third groove AC may limit the shift of the first cover plate assembly LS1 shown in FIG. 22, thereby improving sealing effect of the first cover plate assembly LS1.

As shown in FIGS. 2, 5 and 22, in a case where a border of the main display screen(s) 130, a border of the auxiliary display screen 140, or a border of the audio assembly 150 are in contact with the first grooves JZ, and the first grooves JZ are not provided with the first magnetic assemblies CZ1 and the first cover plate assembly LS1 is not provided, the border of the main display screen 130, the border of the auxiliary display screen 140, or the border of the audio assembly 150 may be stuck in third grooves AC, thereby ensuring that the main display screen 130, the auxiliary display screen 140, and the audio assembly 150 are firmly mounted to the frame.

For example, as shown in FIGS. 2, 5 and 22, in the case where the frame is applied to the multi-screen interactive display device, if the frame is in the assembled state, the first groove JZ in the second horizontal beam HL2, the first groove JZ in the third horizontal beam HL3, the first groove JZ in the first vertical beam SL1, and the first groove JZ in the third groove SL3 are in contact with a border of the first main display screen 131. The first groove JZ in the second horizontal beam HL2, the first groove JZ in the third horizontal beam HL3, the first groove JZ in the second vertical beam SL2, and the first groove JZ in the fourth groove SL4 are in contact with a border of the second main display screen 132. If gaps between these borders and these horizontal beams or vertical beams are large, the first main display screen 131 and the second main display screen 132 are likely to fall off the frame. In this case, the border of the first main display screen 131 may be stuck in the third groove AC disposed in the first section extension surface M1 of the second horizontal beam HL2, the third groove AC disposed in the first section extension surface M1 of the third horizontal beam HL3, the third groove AC disposed in the first section extension surface M1 of the first vertical beam SL1, and the third groove AC disposed in the first section extension surface M1 of the third vertical beam SL3. The border of the second main display screen 132 is stuck in the third groove AC disposed in the first section extension surface M1 of the second horizontal beam HL2, the third groove AC disposed in the first section extension surface M1 of the third horizontal beam HL3, the third groove AC disposed in the first section extension surface M1 of the second vertical beam SL2, and the third groove AC disposed in the first section extension surface M1 of the fourth vertical beam SL4.

Similarly, as shown in FIGS. 2, 5 and 22, in the case where the frame is applied to the multi-screen interactive display device, if the frame is in the assembled state, the first groove JZ in the first vertical beam SL1 and the first groove JZ in the fourth horizontal beam HL4 are in contact with a border of the first audio device 151 (in a case where the first groove JZ in the third horizontal beam HL3 is in contact with the first main display screen 131, a surface of the third horizontal beam HL3 that is in contact with the border of the first audio device 151 is the fourth section extension surface M4 of the third horizontal beam HL3), the first groove JZ in the second vertical beam SL2 and the first groove JZ in the fourth horizontal beam HL4 are in contact with a border of the second audio device 152 (in the case where the first groove JZ in the third horizontal beam HL3 is in contact with the first main display screen 131, a surface of the third horizontal beam HL3 that is in contact with the border of the second audio device 152 is the fourth section extension surface M4 of the third horizontal beam HL3), and the first groove JZ in the fourth horizontal beam HL4 is in contact with the border of the auxiliary display screen 140 (in the case where the first groove JZ in the third horizontal beam HL3 is in contact with the first main display screen 131, a surface of the third horizontal beam HL3 that is in contact with the border of the auxiliary display screen 140 is the fourth section extension surface M4 of the third horizontal beam HL3). In this case, the border of the first audio device 151 is stuck in the third groove AC disposed in the first section extension surface M1 of the first vertical beam SL1 and the third groove AC disposed in the first section extension surface M1 of the fourth horizontal beam HL4. The border of the second audio device 152 is stuck in the third groove AC disposed in the first section extension surface M1 of the second vertical beam SL2 and the third groove AC disposed in the first extension M1 of the fourth horizontal beam HL4. The border of the auxiliary display screen 140 may be stuck in the third groove AC disposed in the first section extension surface M1 of the fourth horizontal beam HL4.

It will be noted that, as shown in FIG. 22, the magnet(s) included in the first magnetic assembly CZ1 may be stuck in the first groove JZ, or may be pre-embedded in the first groove JZ. In order to ensure that the magnet(s) do not come out of the first groove JZ, a clamping piece may be disposed at an edge of the opening of the first groove JZ, or the opening of the first groove JZ is reduced, so that the magnet(s) cannot come out of the opening of the first groove JZ.

Figure 23:
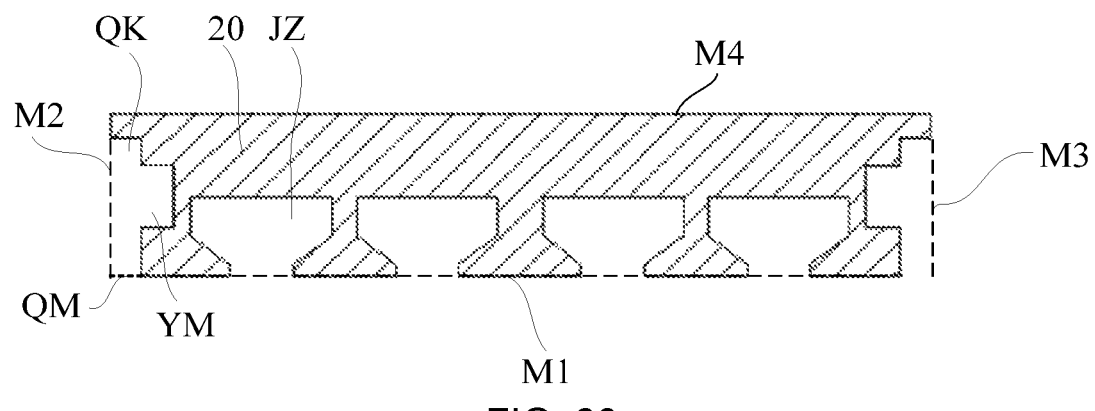
FIG. 23 is a third sectional view taken along line A-A in FIG. 9.

In some embodiments, as shown in FIG. 5, in a case where the border of the main display screen 130, the border of the auxiliary display screen 140, and the border of the audio assembly 150 are in contact with the horizontal beam assembly 110H and the vertical beam assembly 110S, gaps between these borders and these horizontal beams or vertical beams are large, and particles such as dust can easily enter the gaps and are difficult to clean. On this basis, as shown in FIG. 23, the second section extension surface M2 or the third section extension surface M3 of the profile section 20 is provided with a notch groove QK extending in the section extension direction of the profile section 20, or both the second section extension surface M2 and the third section extension surface M3 of the profile section 20 are provided with a notch groove QK extending in the section extension direction of the profile section 20. The notch groove QK includes a notch surface QM. The notch surface QM of the notch groove QK is in a same surface as the first section extension surface M1.

Figure 24:
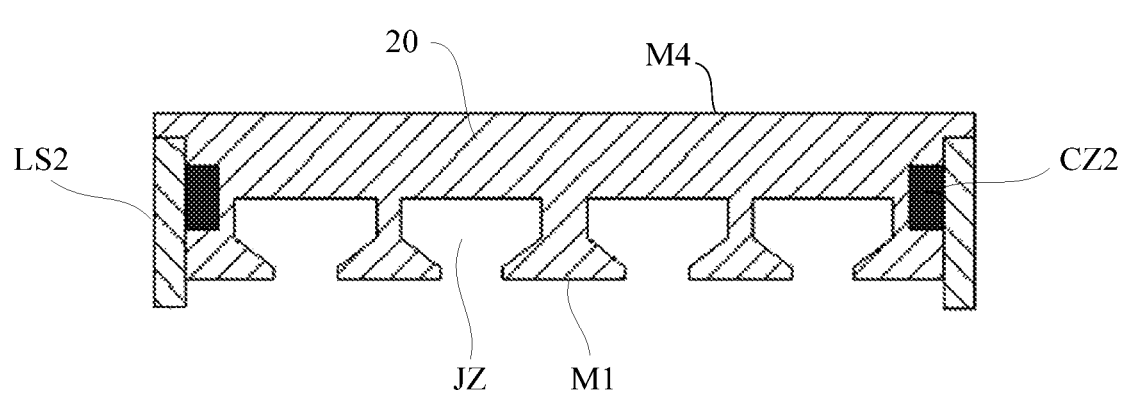
FIG. 24 is a schematic diagram showing an assembled state of the profile section in FIG. 23, second cover plate assemblies, and second magnetic assemblies.

As shown in FIG. 24, the frame further includes at least one second magnetic assembly CZ2 and at least one second cover plate assembly LS2. When the assembly of the frame is accomplished, the second magnetic assembly CZ2 is disposed in the notch groove QK, and the at least one second cover plate assembly LS2 is attracted to the opening of the notch groove QK where the second magnetic assembly CZ2 is located, so that the second cover plate assembly LS2 may seal the notch groove QK. The second cover plate assembly LS2 extends out of the profile section 20 from the notch surface QM of the notch groove QK. With respect to a detailed description of the second magnetic assembly CZ2 and the second cover plate assembly LS2, reference may be made to the foregoing related description of the first magnetic assembly CZ1 and the first cover plate assembly LS1. It will be understood that, a pre-embedding hole YM may be disposed at the bottom of the notch groove QK, and a second magnetic assembly is pre-embedded in the notch groove QK to prevent the second magnetic assembly from coming out of the notch groove QK.

For example, as shown in FIGS. 5, 23 and 24, when the assembly of the frame is accomplished, second section extension surfaces M2 of profile sections 20 used by the second horizontal beam HL2 and the third horizontal beam HL3 are located on a front of the frame. In this case, the first section extension surface M1 of the second horizontal beam HL2 is in contact with the first main display screen 131 and the second main display screen 132. In order to prevent the dust from entering a gap between the second horizontal beam HL2 and the first main display screen 131 (or in order to prevent the dust from entering a gap between the second horizontal beam HL2 and the second main display screen 132), the second section extension surface M2 of the profile section 20 used by the second horizontal beam HL2 is provided with a notch groove QK, and the notch groove QK is provided with a plurality of magnets therein, and then a second cover plate assembly LS2 is placed in the notch groove QK, and extends out of the second horizontal beam HL2 from the notch surface QM. In this way, the gap between the second horizontal beam HL2 and the first main display screen 131 and the gap between the second horizontal beam HL2 and the second main display screen 132 may be blocked, thereby preventing the dust from entering the gaps.

Based on the structure of the frame, an installation process of the multi-screen interactive display device provided by the embodiments of the present disclosure is as follows. Hereinafter, only the installation process of the multi-screen interactive display device is described, and the signal connection is not described.

In a first step, as shown in FIGS. 5, 10 to 17 and 20 to 24, the horizontal beam assembly 110H and the vertical beam assembly 110S are fixed together by using the adapter assemblies. Here, the fixing manner adopted by the horizontal beam assembly 110H and the vertical beam assembly 110S is a combination of the second fixing manner and the third fixing manner. With respect to which fixing manner is used in the installation process, a selection may be made with reference to the foregoing description. In addition, sections of each vertical beam, each horizontal beam, and each arc-shaped connector (perpendicular to the section extension surface of the profile section) may be the same or different, and suitable sectional structures are selected according to positions where each vertical beam, each horizontal beam, and each arc-shaped connector are located. For example, FIGS. 20, 21 and 23 show structures of profile sections with three different sections, with respect to the first vertical beam SL1 and the second vertical beam SL2, profile sections shown in FIGS. 20 and 21 may be selected. With respect to the second horizontal beam HL2, the third horizontal beam HL3, and the fourth horizontal beam HL4, a profile section shown in FIG. 23 is selected.

In a second step, as shown in FIGS. 5, 10 to 17 and 20 to 24, the camera as the image capture device 120 is suspended on the first horizontal beam HL1. Specifically, the camera may be suspended on the first horizontal beam HL1 in the first fixing manner. The first main display screen 131 and the second main display screen 132 are disposed in two main display regions R2, and the auxiliary display screen 140, the first audio device 151 and the second audio device 152 are disposed between the third horizontal beam HL3 and the fourth horizontal beam HL4. The button assembly 170 and the interface assembly 180 are disposed on the horizontal beam assembly 110H or the vertical beam assembly 110S according to actual use frequencies.

In a third step, as shown in FIGS. 5, 10 to 17 and 20 to 24, the exposed first groove JZ is filled by using the first cover plate assembly LS1, or the exposed notch groove QK is filled by using the second cover plate assemblies LS2 according to actual conditions. Finally, the back plate assembly 1108 is mounted on the horizontal beam assembly 110H and the vertical beam assembly 110S.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A frame, comprising:
    a plurality of profile sections, wherein each profile section includes at least one section extension surface, and one of the at least one section extension surface is provided with at least one first groove therein;
    at least one first adapter assembly, wherein each first adapter assembly includes a first position-limiting block provided with at least one first mounting hole therein; and
    a back plate assembly;
    wherein the first position-limiting block is configured to be fixed in one first groove during assembly, and to fix other components to at least one profile section through the at least one first mounting hole, and
    wherein the first position-limiting block is specifically configured to fix the back plate assembly and profile sections together through the at least one first mounting hole.

2. The frame according to claim 1, wherein each first adapter assembly further includes at least one position-limiting post; and
    the at least one position-limiting post is configured to fix the first position-limiting block in the first groove.

3. The frame according to claim 2, wherein the first groove includes an opening and a bottom; in a case where the first position-limiting block is fixed in the first groove, the at least one position-limiting post is further configured to abut against the bottom of the first groove.

4. The frame according to claim 2, wherein the first position-limiting block further includes at least one position-limiting through hole; the position-limiting post is further configured to fix the first position-limiting block in the first groove through one position-limiting through hole.

5. The frame according to claim 1, wherein the first groove includes an opening and a bottom, and the first position-limiting block has an edge abutting surface; a width of the first groove is gradually increasing in a direction in which a depth of the first groove increases; and
    in a case where the first position-limiting block is fixed in the first groove, the edge abutting surface of the first position-limiting block is configured to abut against a part of a side wall of the first groove proximate to the opening of the first groove.

6. The frame according to claim 1, wherein the first groove includes a position-limiting region and an accommodating region in a direction in which a depth of the first groove increases; a width of the position-limiting region gradually increases in the direction in which the depth of the first groove increases, and a width of the accommodating region is unchanged; and
    in a case where the first position-limiting block is fixed in the first groove, the first position-limiting block is further configured to abut against a side wall of the position-limiting region.

7. The frame according to claim 1, wherein the first groove includes an opening and a bottom; a thickness of the first position-limiting block is less than a minimum width of the first groove, and a width of the first position-limiting block is less than a maximum width of the first groove.

8. The frame according to claim 1, wherein the frame further includes at least one second adapter assembly, the plurality of profile sections include a first profile section and a second profile section, and one of the at least one second adapter assembly is configured to fix the first profile section and the second profile section together.

9. The frame according to claim 8, wherein each second adapter assembly includes a locking sub-assembly and an adapter sub-assembly;
    the locking sub-assembly includes a first positioning member and a second positioning member, and the first positioning member is provided with a locking through hole;
    the adapter sub-assembly includes a connecting rod, and the connecting rod is provided with a second groove, and the second groove includes an opening and a bottom;
    the connecting rod is configured to be fixed in a first groove of the first profile section, and the first positioning member is configured to be fixed in a first groove of the second profile section; and
    the connecting rod is further configured to pass through the locking through hole in an extending direction of the connecting rod, and the second positioning member is configured to pass through the locking through hole in a depth direction of the locking through hole and enter the second groove to fix the connecting rod to the first positioning member.

10. The frame according to claim 9, wherein the second adapter assembly further includes a position-limiting spring, and the locking sub-assembly further includes a position-limiting sleeve;
the position-limiting sleeve is configured to be sleeved on the connecting rod, and the position-limiting spring is configured to be sleeved on the connecting rod;
in a case where the second positioning member fixes the connecting rod to the first positioning member, the position-limiting spring is located between the position-limiting sleeve and the second positioning member and is in a compressed state.

11. The frame according to claim 10, wherein the position-limiting spring includes a first end and a second end, and the position-limiting spring is further configured such that the first end thereof abuts against the position-limiting sleeve in a free state, and the second end thereof is located in a region enclosed by an edge of the opening of the second groove.

12. The frame according to claim 9, wherein a width of the second groove gradually decreases in a direction in which a depth of the second groove increases; or
the second groove is a tapered groove, and the second positioning member includes a tapered end.

13. The frame according to claim 9, wherein in a case where the connecting rod passes through the locking through hole in the extending direction of the connecting rod, the connecting rod is further configured to extend out of the first profile section in a section extension direction of the first profile section.

14. The frame according to claim 9, wherein in a case where the connecting rod passes through the locking through hole in the extending direction of the connecting rod, the connecting rod is further configured to extend out of the first profile section from an opening of the first groove of the first profile section in a depth direction of the first groove of the first profile section.

15. The frame according to claim 1, wherein the first groove includes a bottom and an opening, and the at least one section extension surface includes a first section extension surface;
at least one first groove is disposed in the first section extension surface, and the at least one first groove in the first section extension surface extends in a section extension direction of the profile section;
the frame further comprises at least one first cover plate assembly and at least one first magnetic assembly; and
wherein the first magnetic assembly is configured to be disposed in the first groove, and the first cover plate assembly is configured to be attracted to the opening of the first groove where the first magnetic assembly is located.

16. The frame according to claim 15, wherein the first section extension surface is provided with a third groove, and the at least one first groove is disposed at a bottom of the third groove.

17. The frame according to claim 15, wherein at least one section extension surface further includes a second section extension surface, or a third section extension surface, or a second section extension surface and a third section extension surface;
the second section extension surface or the third section extension surface is provided with at least one notch groove extending in the section extension direction of the profile section, or both the second section extension surface and the third section extension surface is provided with at least one notch groove extending in the section extension direction of the profile section;
a notch groove includes a notch surface, and the notch surface is in a same surface as the first section extension surface;
the second section extension surface and the third section extension surface are both adjacent to the first section extension surface;
the frame further comprises at least one second cover plate assembly and at least one second magnetic assembly; and
wherein the second magnetic assembly is configured to be disposed in the notch groove, and the second cover plate assembly is configured to be attracted to an opening of the notch groove where the second magnetic assembly is located; and the second cover plate assembly is further configured to extend out of the profile section from the notch surface of the notch groove.

18. A multi-screen interactive display device, comprising the frame according to claim 1.

19. The multi-screen interactive display device according to claim 18, wherein the plurality of profile sections are configured to enclose an image capture region, at least one main display region, an auxiliary display region, and an audio playback region after the assembly is accomplished; and the image capture region, the at least one main display region and the auxiliary display region are distributed in a height direction of the assembled frame, the audio playback region and the auxiliary display region are located at a same side of the at least one main display region in the height direction of the assembled frame, and the multi-screen interactive display device further includes an image capture device, at least one main display screen, an auxiliary display screen, and an audio assembly; and
the image capture device is configured to be disposed in the image capture region of the frame; the at least one main display screen is configured to be disposed in the at least one main display region of the assembled frame; and the auxiliary display screen is configured to be disposed in the auxiliary display region of the assembled frame, and the audio assembly is configured to communicate with the at least one main display screen, or the auxiliary display screen, or the at least one main display screen and the auxiliary display screen, and to be disposed in the audio playback region of the assembled frame.

20. A frame, comprising:
a plurality of profile sections, wherein each profile section includes at least one section extension surface, and one of the at least one section extension surface is provided with at least one first groove therein; and
at least one first adapter assembly, wherein each first adapter assembly includes a first position-limiting block provided with at least one first mounting hole therein;
wherein the first position-limiting block is configured to be fixed in one first groove during assembly, and to fix other components to at least one profile section through the at least one first mounting hole;
the first groove includes a bottom and an opening, and the at least one section extension surface includes a first section extension surface; and
at least one first groove is disposed in the first section extension surface, and the at least one first groove in the first section extension surface extends in a section extension direction of the profile section;

the frame further comprises at least one first cover plate assembly and at least one first magnetic assembly; and wherein the first magnetic assembly is configured to be disposed in the first groove, and the first cover plate assembly is configured to be attracted to the opening of the first groove where the first magnetic assembly is located.

* * * * *